United States Patent
Wu et al.

(10) Patent No.: US 10,299,057 B2
(45) Date of Patent: *May 21, 2019

(54) APPARATUS AND METHOD FOR SOUND STAGE ENHANCEMENT

(71) Applicant: AMBIDIO, INC., Burbank, CA (US)

(72) Inventors: Tsai-Yi Wu, Burbank, CA (US); Pei-Lun Hsieh, Burbank, CA (US)

(73) Assignee: AMBIDIO, INC., Burbank, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/965,421

(22) Filed: Apr. 27, 2018

(65) Prior Publication Data

US 2018/0249269 A1 Aug. 30, 2018

Related U.S. Application Data

(63) Continuation of application No. 15/963,916, filed on Apr. 26, 2018, which is a continuation of application No. PCT/US2015/057616, filed on Oct. 27, 2015.

(51) Int. Cl.
*H04S 3/02* (2006.01)
*H04S 5/00* (2006.01)
(Continued)

(52) U.S. Cl.
CPC .............. *H04S 3/02* (2013.01); *G10K 11/175* (2013.01); *H03G 5/165* (2013.01); *H04R 5/04* (2013.01);
(Continued)

(58) Field of Classification Search
CPC ..... H04S 3/02; H04S 5/00; H04S 5/02; H04S 2400/03; H04S 2420/01; H04S 2420/03;
(Continued)

(56) References Cited

U.S. PATENT DOCUMENTS

2003/0219130 A1* 11/2003 Baumgarte ........... G10L 19/008
381/17
2003/0236583 A1* 12/2003 Baumgarte ........... G10L 19/008
700/94

(Continued)

FOREIGN PATENT DOCUMENTS

JP 2007-208318 A 8/2007

OTHER PUBLICATIONS

Ambidio, International Search Report and Written Opinion, PCT/US2015/057616, dated Aug. 8, 2016, 16 pgs.

(Continued)

*Primary Examiner* — Andrew C Flanders
(74) *Attorney, Agent, or Firm* — Morgan, Lewis & Bockius LLP

(57) ABSTRACT

A method for processing an audio signal is performed at a computing device. The method includes the following steps: receiving a digital stereo audio input signal; extracting localization cues from the digital stereo audio input signal; generating a left-side component and a right-side component from the digital stereo audio input signal, at least partially, in accordance with the localization cues; performing crosstalk cancellation to the left-side component and the right-side component, respectively, to obtain a crosstalk-cancelled left-side component and a crosstalk-cancelled right-side component; and generating a digital stereo audio output signal including the crosstalk-cancelled left-side component and the crosstalk-cancelled right-side component.

21 Claims, 18 Drawing Sheets

(51) Int. Cl.
*H04R 5/04* (2006.01)
*H04S 1/00* (2006.01)
*G10K 11/175* (2006.01)
*H03G 5/16* (2006.01)
*H04S 7/00* (2006.01)

(52) U.S. Cl.
CPC .............. *H04S 1/007* (2013.01); *H04S 5/005* (2013.01); *H04S 7/307* (2013.01); *G10K 2210/3218* (2013.01); *H04S 2400/01* (2013.01); *H04S 2420/01* (2013.01)

(58) Field of Classification Search
CPC ....... H04S 1/007; H04S 5/005; G10L 19/008; G10L 19/0017; G10L 19/02; G10L 21/04; H04R 5/00; H04R 5/04; H04M 7/30
See application file for complete search history.

(56) References Cited

U.S. PATENT DOCUMENTS

| | | | |
|---|---|---|---|
| 2004/0136554 A1 | 7/2004 | Kirkeby | |
| 2005/0053242 A1* | 3/2005 | Henn | G10L 19/008 381/22 |
| 2005/0157883 A1* | 7/2005 | Herre | G10L 19/008 381/17 |
| 2006/0115100 A1* | 6/2006 | Faller | G10L 19/008 381/119 |
| 2006/0126851 A1 | 6/2006 | Yuen et al. | |
| 2007/0269063 A1* | 11/2007 | Goodwin | G10L 19/008 381/310 |
| 2008/0049943 A1* | 2/2008 | Faller | G10L 19/008 381/17 |
| 2009/0037189 A1* | 2/2009 | Jung | G10L 19/008 704/500 |
| 2009/0067634 A1* | 3/2009 | Oh | H04S 3/008 381/17 |
| 2009/0252356 A1* | 10/2009 | Goodwin | G10L 19/173 381/310 |
| 2011/0243338 A1 | 10/2011 | Phillip | |
| 2013/0163766 A1* | 6/2013 | Choueiri | H04R 3/04 381/17 |
| 2013/0322636 A1 | 12/2013 | Vickers | |
| 2016/0227338 A1* | 8/2016 | Oh | H04S 7/303 |
| 2016/0249151 A1* | 8/2016 | Grosche | H04S 1/002 |

OTHER PUBLICATIONS

Ambidio, International Preliminary Report on Patentability, PCT/US2015/057616, dated May 1, 2018, 13 pgs.
Wu, Office Action, U.S. Appl. No. 15/963,916, dated Sep. 20, 2018, 10 pgs.
Wu, Notice of Allowance, U.S. Appl. No. 15/963,916, dated Feb. 25, 2019, 5 pgs.
Wu, Office Action, U.S. Appl. No. 15/965,434, dated Sep. 20, 2018, 10 pgs.
Wu, Final Office Action, U.S. Appl. No. 15/965,434, dated Feb. 28, 2019, 8 pgs.
Wu, Office Action, U.S. Appl. No. 15/965,446, dated Sep. 20, 2018, 11 pgs.
Wu, Notice of Allowance, U.S. Appl. No. 15/965,446, dated Feb. 14, 2019, 5 pgs.

* cited by examiner

*701*

After performing equalization to the left-side component and the right-side component using the first bandpass filter:

*703*

Remove a predefined frequency band from the left-side component and the right-side component using a second bandpass filter

After performing equalization to the left-side component and the right-side component using the first bandpass filter:

*713*

Perform first dynamic range compression to the left-side component and the right-side component to highlight a predefined frequency band with respect to other frequencies

After combining the left-side residual component and the right-side residual component into the left-side component and the right-side component, respectively:

*723*

Perform second dynamic range compression to the left-side component and the right-side component to preserve the localization cues in the digital audio output signal

FIG. 7C

APPARATUS AND METHOD FOR SOUND STAGE ENHANCEMENT

PRIORITY CLAIM AND RELATED APPLICATION

This application is a continuation application of U.S. patent application Ser. No. 15/963,916, entitled "APPARATUS AND METHOD FOR SOUND STAGE ENHANCEMENT", filed Apr. 26, 2018 which is a continuation application of PCT Patent Application No. PCT/US2015/057616 entitled "APPARATUS AND METHOD FOR SOUND STAGE ENHANCEMENT" filed on Oct. 27, 2015, all of which are hereby incorporated by reference in their entirety.

TECHNICAL FIELD

The present application is related generally to audio signal processing and in particular to a computer implemented method, apparatus, and computer usable program code for sound stage enhancement.

BACKGROUND

Binaural hearing improves performance in most listening tasks. Two-channel stereophonic became the standard consumer medium in the late 1950's, and is still the most commonly used playback system even after 84 years of its introduction. Marching from mono to stereo to multichannel, consumers are continuously pursuing a more immersive listening experience. Previous and current efforts on creating immersive sound have primarily focused on using multiple speakers or Head-Related Transfer Functions (HRTF) related approaches to simulate virtual speakers only.

Although a lot of efforts have been carried out in the field of immersive sound in last decades, there are still various limitations with existing systems. For instance, it is difficult to create a true 360° sound effect with simulated virtual speakers and the listener has to stay at a fixed point to have the desired outcome. This is typically done by applying a set of directional transfer function, for example, Head-Related Transfer Functions or Binaural Room Impulse Response, to the sound sources. Another conventional solution is to incorporate more and more loudspeakers, e.g., 22 channels plus 2 subwoofer channels, into the sound system. This approach might be impractical in many cases because of the high costs and large space required for implementation.

SUMMARY

An object of the present application is to develop a robust sound stage enhancement method in connection with a data processing system such as a desktop or a laptop. The method can create an immersive sound effect from an audio input signal that can be a mono signal, a stereo signal or a multi-channel signal.

According to a first aspect of the present application, a method for processing an audio signal is performed at a computing device having one or more processors, at least two speakers, memory, and a plurality of program modules stored in the memory and to be executed by the one or more processors. The method includes the following steps: receiving a digital stereo audio input signal; extracting localization cues from the digital stereo audio input signal; generating a left-side component and a right-side component from the digital stereo audio input signal, at least partially, in accordance with the localization cues; performing crosstalk cancellation to the left-side component and the right-side component, respectively, to obtain a crosstalk-cancelled left-side component and a crosstalk-cancelled right-side component; and generating a digital stereo audio output signal including the crosstalk-cancelled left-side component and the crosstalk-cancelled right-side component. According to another aspect of the present application, a computing device comprises: one or more processors; memory; and a plurality of program modules stored in the memory and to be executed by the one or more processors. The plurality of program modules, when executed by the one or more processors, cause the computing device to perform the method described above for processing an audio signal. According to yet another aspect of the present application, a computer program product stored in a non-transitory computer-readable storage medium in conjunction with a computing device having one or more processors, the computer program product including a plurality of program modules that, when executed by the one or more processors, cause the computing device to perform the method described above for processing an audio signal.

According to a second aspect of the present application, a method for processing an audio signal is performed at a computing device having one or more processors, at least two speakers, memory, and a plurality of program modules stored in the memory and to be executed by the one or more processors. The method includes: receiving a digital mono audio input signal; panning the digital mono audio input signal into a left-side component and a right-side component, respectively; upmixing two copies of the digital mono audio input signal with the left-side component and the right-side component, respectively, wherein there is a predefined time interval between the two copies of the middle component; performing crosstalk cancellation to the left-side component and the right-side component, respectively, to obtain a crosstalk-cancelled left-side component and a crosstalk-cancelled right-side component; and generating a digital stereo audio output signal including the crosstalk-cancelled left-side component and the crosstalk-cancelled right-side component. According to another aspect of the present application, a computing device comprises: one or more processors; memory; and a plurality of program modules stored in the memory and to be executed by the one or more processors. The plurality of program modules, when executed by the one or more processors, cause the computing device to perform the method described above for processing an audio signal. According to yet another aspect of the present application, a computer program product stored in a non-transitory computer-readable storage medium in conjunction with a computing device having one or more processors, the computer program product including a plurality of program modules that, when executed by the one or more processors, cause the computing device to perform the method described above for processing an audio signal.

According to a third aspect of the present application, a method for processing an audio signal is performed at a computing device having one or more processors, at least two speakers, memory, and a plurality of program modules stored in the memory and to be executed by the one or more processors. The method includes: receiving a digital stereo audio input signal; extracting a middle component, a left-side component and a right-side component from the digital stereo audio input signal; panning the middle component into the left-side component and the right-side component, respectively; creating first and second copies of the middle component, wherein there is a predefined time interval between the first and second copies of the middle component; combining the first copy of the middle component with the left-side component into a left channel and the second copy of the middle component with the right-side component into a right channel, respectively; and generating a digital stereo audio output signal including the left channel and the right channel. According to another aspect of the present application, a computing device comprises: one or more processors; memory; and a plurality of program modules stored in the memory and to be executed by the one or more processors. The plurality of program modules, when executed by the one or more processors, cause the computing device to perform the method described above for processing an audio signal. According to yet another aspect of the present application, a computer program product stored in a non-transitory computer-readable storage medium in conjunction with a computing device having one or more processors, the computer program product including a plurality of program modules that, when executed by the one or more processors, cause the computing device to perform the method described above for processing an audio signal.

According to a fourth aspect of the present application, a method for processing an audio signal is performed at a computing device having one or more processors, memory, and a plurality of program modules stored in the memory and to be executed by the one or more processors. The method includes: receiving a digital audio input signal; performing equalization to the digital audio input signal by enhancing the digital audio input signal within a predefine frequency range and generating a residual audio signal from the equalized audio signal; performing dynamic range compression to the equalized audio signal; performing crosstalk cancellation to the equalized audio signal to obtain a crosstalk-cancelled audio signal; and combining the crosstalk-cancelled audio signal and the residual audio signal into a digital audio output signal. According to another aspect of the present application, a computing device comprises: one or more processors; memory; and a plurality of program modules stored in the memory and to be executed by the one or more processors. The plurality of program modules, when executed by the one or more processors, cause the computing device to perform the method described above for processing an audio signal. According to yet another aspect of the present application, a computer program product stored in a non-transitory computer-readable storage medium in conjunction with a computing device having one or more processors, the computer program product including a plurality of program modules that, when executed by the one or more processors, cause the computing device to perform the method described above for processing an audio signal.

BRIEF DESCRIPTION OF DRAWINGS

The accompanying drawings, which are included to provide a further understanding of the embodiments and are incorporated herein and constitute a part of the specification, illustrate the described embodiments and together with the description serve to explain the underlying principles. Like reference numerals refer to corresponding parts.

FIGS. 7A-7C are flowcharts of dynamic range compression of an audio signal in accordance with an illustrative embodiment.

DETAILED DESCRIPTION

Reference will now be made in detail to embodiments, examples of which are illustrated in the accompanying drawings. In the following detailed description, numerous non-limiting specific details are set forth in order to assist in understanding the subject matter presented herein. But it will be apparent to one of ordinary skill in the art that various alternatives may be used without departing from the scope of claims and the subject matter may be practiced without these specific details. For example, it will be apparent to one of ordinary skill in the art that the subject matter presented herein can be implemented on many types of radio communication systems such as smartphones and tablets.

Figure 1:
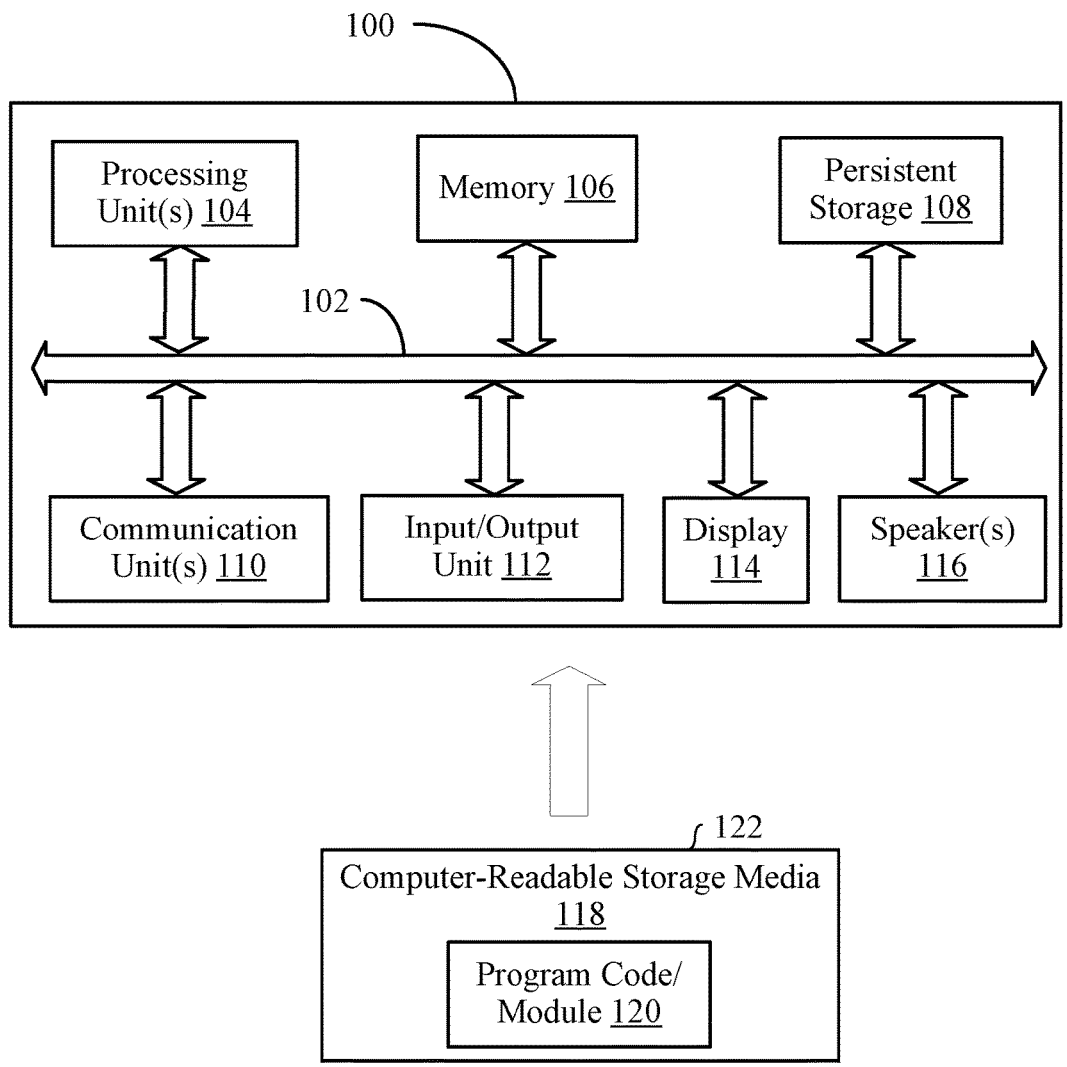
FIG. 1 is a block diagram of a computer system in accordance with an illustrative embodiment of the present application.

With reference now to the figures and in particular with reference to FIG. 1, exemplary block diagrams of data processing environments are provided in which illustrative embodiments may be implemented. It should be appreciated that FIG. 1 is only exemplary and are not intended to assert or imply any limitation with regard to the environments in which different embodiments may be implemented. Many modifications to the depicted environments may be made.

FIG. 1 depicts a block diagram of a data processing system 100 in accordance with an illustrative embodiment of the present application. In this illustrative example, the data processing system 100 includes communications fabric 102, which provides communications between processor unit 104, memory 106, persistent storage 108, communications unit 110, input/output (I/O) unit 112, display 114, and one or more speakers 116. Note that the speakers 116 may be built into the data processing system 100 or external to the data processing system 100. In some embodiments, the data processing system 100 make take the form of a laptop computer, a desktop computer, a tablet computer, a mobile phone (such as a smartphone), a multimedia player device, a navigation device, an educational device (such as a child's learning toy), a gaming system, or a control device (e.g., a home or industrial controller).

Processor unit 104 serves to execute instructions for software programs that may be loaded into memory 106. Processor unit 104 may be a set of one or more processors or may be a multi-processor core, depending on the particular implementation. Further, processor unit 104 may be implemented using one or more heterogeneous processor systems in which a main processor is present with secondary processors on a single chip. As another illustrative example, processor unit 104 may be a symmetric multi-processor system containing multiple processors of the same type.

Memory 106, in these examples, may be a random access memory or any other suitable volatile or non-volatile storage device. Persistent storage 108 may take various forms depending on the particular implementation. For example, persistent storage 108 may contain one or more components or devices such as a hard drive, a flash memory, a rewritable optical disk, a rewritable magnetic tape, or some combination of the above. The media used by persistent storage 108 may also be removable. For example, a removable hard drive may be used for persistent storage 108.

Communications unit 110, in these examples, provides for communications with other data processing systems or devices. In these examples, communications unit 110 is a network interface card. Communications unit 110 may provide communications through the use of either or both physical and wireless communications links.

Input/output unit 112 allows for input and output of data with other devices that may be connected to data processing system 100. For example, input/output unit 112 may provide a connection for user input through a keyboard and mouse. Further, input/output unit 112 may send output to a printer. Display 114 provides a mechanism to display information to a user. Speakers 116 play out sounds to the user.

Instructions for the operating system and applications or programs are located on persistent storage 108. These instructions may be loaded into memory 106 for execution by processor unit 104. The processes of the different embodiments as described below may be performed by processor unit 104 using computer implemented instructions, which may be located in a memory, such as memory 106. These instructions are referred to as program code (or module), computer usable program code (or module), or computer readable program code (or module) that may be read and executed by a processor in processor unit 104. The program code (or module) in the different embodiments may be embodied on different physical or tangible computer readable media, such as memory 106 or persistent storage 108.

Program code/module 120 is located in a functional form on the computer readable storage media 118 that is selectively removable and may be loaded onto or transferred to data processing system 100 for execution by processor unit 104. Program code/module 120 and computer readable storage media 118 form computer program product 122 in these examples. In one example, computer readable storage media 118 may be in a tangible form, such as, for example, an optical or magnetic disc that is inserted or placed into a drive or other device that is part of the persistent storage 108 for transfer onto a storage device, such as a hard drive that is part of the persistent storage 108. In a tangible form, the computer readable storage media 118 may also take the form of a persistent storage, such as a hard drive, a thumb drive, or a flash memory that is connected to data processing system 100. The tangible form of computer readable storage media 118 is also referred to as computer recordable storage media. In some instances, the computer readable storage media 118 may not be removable from the data processing system 100.

Alternatively, program code/module 120 may be transferred to data processing system 100 from computer readable storage media 118 through a communications link to communications unit 110 and/or through a connection to input/output unit 112. The communications link and/or the connection may be physical or wireless in the illustrative examples. The computer readable media also may take the form of non-tangible media, such as communications links or wireless transmissions containing the program code/module.

The different components illustrated for data processing system 100 are not meant to provide architectural limitations to the manner in which different embodiments may be implemented. The different illustrative embodiments may be implemented in a data processing system including components in addition to or in place of those illustrated for data processing system 100. Other components shown in FIG. 1 can be varied from the illustrative examples shown.

As one example, a storage device in data processing system 100 is any hardware apparatus that may store data. Memory 106, persistent storage 108 and computer readable storage media 118 are examples of storage devices in a tangible form.

In another example, a bus system may be used to implement communications fabric 102 and may be comprised of one or more buses, such as a system bus or an input/output bus. The bus system may be implemented using any suitable type of architecture that provides for a transfer of data between different components or devices attached to the bus system. Additionally, a communications unit may include one or more devices used to transmit and receive data, such as a modem or a network adapter. Further, a memory may be, for example, memory 106 or a cache such as found in an interface and memory controller hub that may be present in communications fabric 102.

To overcome the issues with the conventional approaches described in the background of the present application, different embodiments of the present application are described below and associated with a set of audio signal processing methods based on psychoacoustic principles to delude the human auditory system. Unlike the conventional methods, there is no requirement for creating simulated or physical speakers. The methods create a 3D-like immersive sound effect while keeping the sound quality unchanged regardless of the number of the input and output channels.

Human auditory system determines the direction of a presented sound event by the interaural difference, and the width of that sound event is mostly contributed by interaural correlation. When a sound wave reaches the two ears, a one-dimensional movement of the eardrum is generated regardless of the nature of that sound source. According to some embodiments, the spatial localization cues are put back into the processed audio signals as inter-channel differences that ultimately move a listener's eardrums in a location-dependent pattern. Unlike the conventional approaches, such a movement is based on a listener's own transfer function (depending on the listener's head shape and other body parts) and different playback environments such as room size and the loudspeaker systems being used. As such, the auditory system is able to analyze and compare the relevant physical cues embedded in the audio signals to extract the presented auditory space and synthesize the sound events.

Figure 2A:
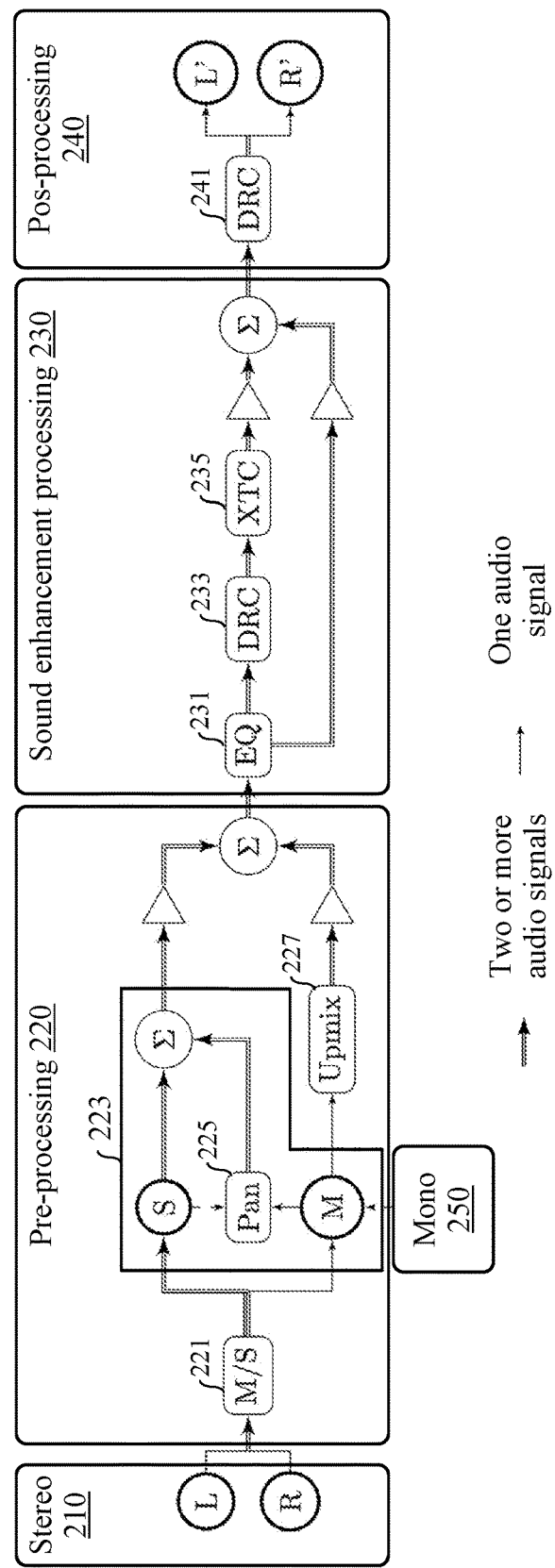
FIG. 2A is a block diagram illustrating a sound processing pipeline of a stereo or mono sound input signal including different stages in accordance with an illustrative embodiment.

FIG. 2A is a block diagram illustrating a sound processing pipeline of a stereo or mono sound input signal including different stages in accordance with an illustrative embodiment. In some embodiments, the input to this pipeline is a stereo audio input signal 210 including a left signal (L) and a right signal (L). In some other embodiments, the input is a mono audio signal 250. The pipeline includes three stages: the pre-processing stage 220, the sound enhancement processing stage 230, and the post-processing stage 240. Each processing stage includes one or more processing blocks for processing the input audio signal and generating an output audio signal accordingly. For example, the pre-processing stage 220 further includes a mid/side (M/S) mixer 221, an audio signal panning tool 223, and an upmixer 227; the sound enhancement processing stage 230 includes an equalizer (EQ) 231, a dynamic range compressor (DRC) 233, and a crosstalk cancellation block 235; and the post-processing stage 240 includes another dynamic range compressor (DRC) 241.

M/S mixer 221 is a mixing tool of generating three components ($side_L$, $side_R$, and mid) from the stereo audio input signal 210. Unlike the conventional M/S mixing tools which only generate one side component and one mono component, the M/S mixer 221 is to separate out the information in the input signal that is useful for various subsequent analyses and to minimize unnecessary distortion in the sound quality (e.g., coloration). By doing so, the correlation between different components generated by the M/S mixer 221 is reduced.

As shown in FIG. 2A, the output of the M/S mixer 221 includes three components, one of which is the mid component (M) and the other two are represented by the letter "5". The mid component M is then the input to the pan block 225. The pan block 225 is responsible for "replacing" the mid signal to anywhere in the sound stage and optimize the overall sound effect or emphasizing certain sound in the sound stage. During this process, the mid signal is treated the same as the mono sound signal 250. A user can change the position of the mid signal (or the mono signal) by applying certain parameters to the panning process based on his/her intention. The panned mid signals ($mid_L$ and $mid_R$) are added to the side components ($side_L$ and $side_R$) generated by the M/S mixer 221, and thus become the new $side_L$ and $side_R$ components.

The upmixer 227 in the pre-processing stage 220 doubles the mid component (or the mono signal) into two copies and adds a predefined time delay to one of the two copies and then adds them to the new $side_L$ and $side_R$ components, respectively, as shown in FIG. 2A. In some embodiments (shown in FIG. 2A), an amplifier is applied to new $side_L$ and $side_R$ components and the upmixed mid/mono components, respectively, before they are combined together. As described below, the time delay between the two copies of the mid component (or the mono signal) is carefully chosen to achieve the so-called precedence effect by adding more stereo width to the audio image that stays in the middle of the sound stage.

As shown in FIG. 2A, the output of the pre-processing stage 220 includes two audio signals, $side_L$ and $side_R$. They are inputs to the sound enhancement processing stage 230 and processed by the different processing blocks therein. For example, the equalizer (EQ) 231 encountered by the two side signals includes one or more multi-band equalizers for performing bandpass filtering to the two side signals. In some embodiments, the multi-band equalizers applied to each side signal are the same. In some other embodiments, the multi-band equalizers applied to one side signal are not the same as those applied to the other side signal. Nonetheless, their functions are to keep the original color of the sound signals and to avoid ambiguous spatial cues present in these two signals. In some embodiments, this EQ 231 can also be used to select the target sound source based on the spectral analysis of the two side components.

As shown in FIG. 2A, the pipeline includes two dynamic range compressors 233 and 241. In some embodiments, the first dynamic range compressor 233 includes a bandpass filtering feature for amplifying the two sound signals within a predefined frequency range in order to maximize the sound stage enhancement effect achieved by the crosstalk cancellation block 235. The second dynamic range compressor 241 is used in the post-processing stage 240 to amplify the overall output level of the sound signals in the audio mastering process.

Crosstalk is an inherent problem in stereo loudspeaker playback. It occurs when a sound reaches the ear on the opposite side from each speaker, and introduces unwanted spectral coloration to the original signal. The solution to this problem is a crosstalk cancellation (XTC) algorithm. One type of the XTC algorithm is to use a generalized directional binaural transfer function, such as Head-Related Transfer Functions (HRTFs) and/or Binaural Room Impulse Response (BRIR), to represent the angles of the two physical loudspeakers with respect to the listener's position.

Another type of the XTC algorithm system, represented by the crosstalk cancellation block 235, is a recursive crosstalk cancellation method that does not require head-related transfer function (HRTF), binaural room impulse response (BRIR), or any other binaural transfer functions. The basic algorithm can be formulated as follows:

$$\text{left}[n] = \text{left}[n] - A_L * \text{right}[n - d_L]$$

$$\text{right}[n] = \text{right}[n] - A_R * \text{left}[n - d_R]$$

where $A_L$ and $A_R$ are the attenuation coefficients of the signal and $d_L$ and $d_R$ are the delays in number of data samples from the respective speakers to the opposite-side ears. A more detailed description of the crosstalk cancellation block 235 can be found in U.S. patent application Ser. No. 14/569,490, entitled "APPARATUS AND METHOD FOR SOUND STAGE ENHANCEMENT" and filed on Dec. 12, 2014, which is incorporated by reference in its entirety.

FIG. 2A depicts that there are two pairs of output signals from the EQ 231. One pair of the output signals (i.e., the pair of bandpass-filtered audio signals) are processed by the DRC 233, the XTC 235 and optionally another amplifier in a row; the other pair of the output signals is defined as residuals between the pair of bandpass-filtered audio signals and the pair of input side signals. This pair of residual signals is then fed into an amplifier before being combined with the two audio signals that has been subject to the crosstalk cancellation operation. As shown in FIG. 2A, the output of the pipeline is a stereo audio signal including a left channel (L') and a right channel (R'). It should be noted that the same pipeline is able to convert a mono audio input signal 250 into a stereo audio signal including a left channel (L') and a right channel (R').

Figure 2B:
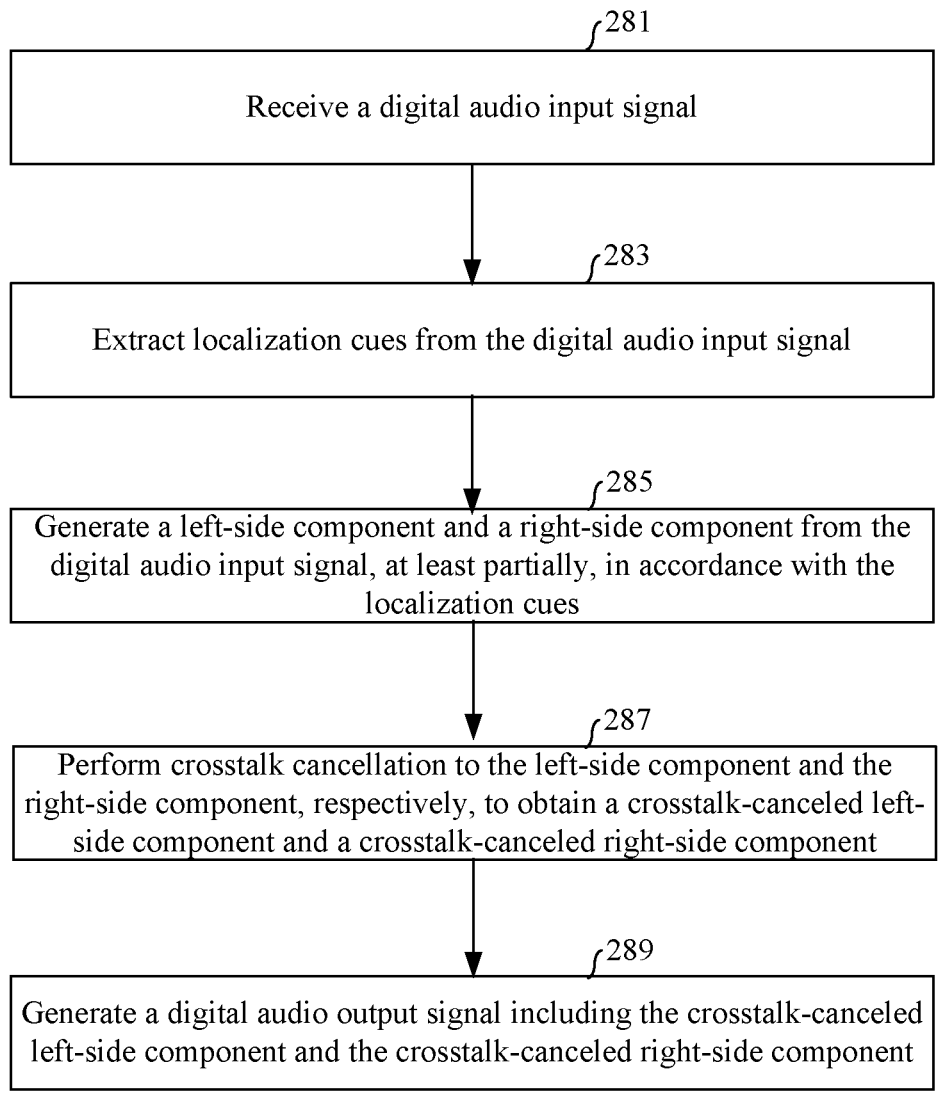
FIG. 2B is a flowchart illustrating a process of creating an immersive sound effect from a stereo audio input signal in accordance with an illustrative embodiment.

FIG. 2B is a flowchart illustrating a process of creating an immersive sound effect from a stereo audio input signal using the data processing system 100 shown in FIG. 1 in accordance with an illustrative embodiment. The data processing system 100 receives (281) a digital audio input signal. In some embodiments, the digital audio input signal includes a left signal (also known as "left channel") and a right signal (also known as "right channel"). The data processing system 100 then extracts (283) localization cues from the digital audio signal. In some embodiments, the localization cues includes the angle of the sound source producing the stereo signal with respect to a listener's location as well as the interaural time difference and the interaural intensity difference between the audio signals arriving at the two ears of the listener. The data processing system 100 then generates (285) a left-side component and a right-side component from the digital audio input signal. In some embodiments, the two side components are generated at least partially based on the localization cues produced by the previous step. Note that the process so far roughly matches the pre-processing stage 220 and the first two blocks in the sound enhancement processing stage 230 as described above in connection with FIG. 2A. Next, the data processing system 100 performs (287) the crosstalk cancellation to the left-side component and the right-side component, respectively, to obtain a crosstalk-cancelled left-side component and a crosstalk-cancelled right side component. In some embodiments, the crosstalk cancellation is a recursive process that uses the right-side component to cancel crosstalk noise in the left-side component and the left-side component to cancel crosstalk noise in the right-side component. After the crosstalk cancellation, the data processing system 100 generates (289) a digital audio output signal including the crosstalk-cancelled left-side component and the crosstalk-cancelled right side component. For example, the data processing system 100 may play the digital audio output signal using its speakers 116 to the listener.

The process described above in connection with FIG. 2B depicts a general workflow of performing sound stage enhancement to a stereo audio signal using the methods disclosed in the present application. More detailed descriptions are provided below for some of the steps shown in FIG. 2B to create an immersive sound effect.

Figure 3A:
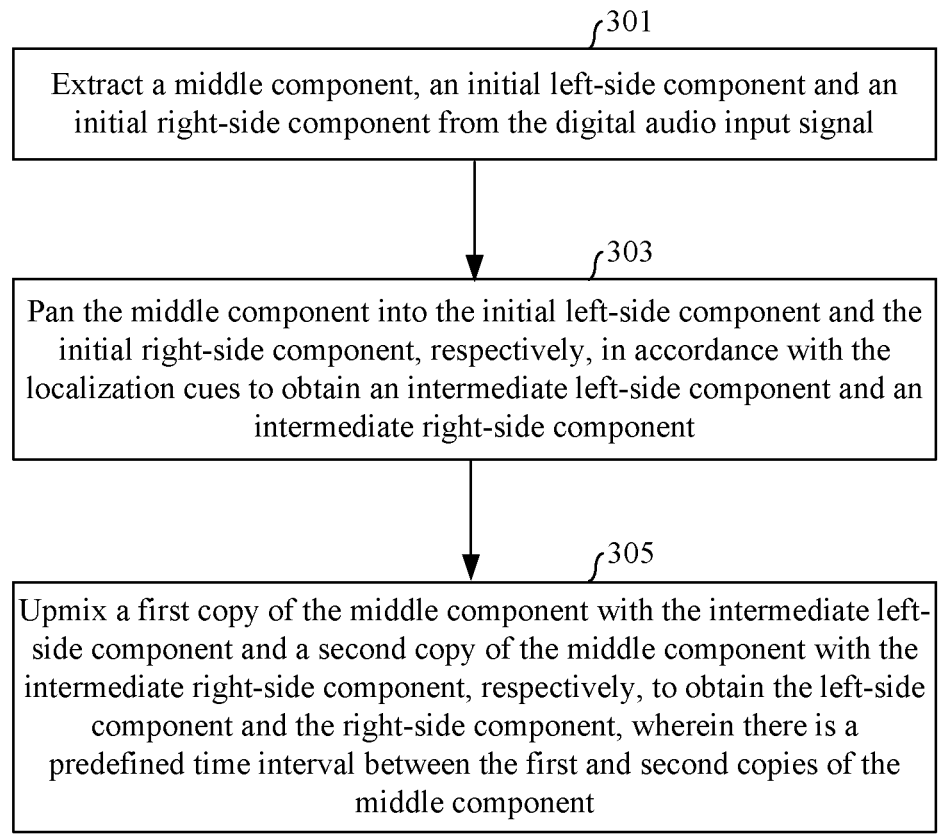
FIG. 3A is a flowchart of pre-processing steps of creating an immersive sound effect from a stereo audio input signal in accordance with an illustrative embodiment.

In particular, FIG. 3A is a flowchart of pre-processing steps of creating an immersive sound effect from a stereo audio input signal in accordance with an illustrative embodiment. These pre-processing steps primarily correspond to the steps 283 and 285 of FIG. 2B. Upon receipt of the digital stereo audio signal, the data processing system 100 extracts (301) a middle component, an initial left-side component, and an initial right-side component from the digital stereo audio signal. As described above in connection with FIG. 2A, this step is carried out by the M/S mixer 221, which splits the two input signals L and R into three components.

Next, the data processing system 100 pans (303) the middle component into the initial left-side component and the initial right-side component, respectively, in accordance with the localization cues to obtain an intermediate left-side component and an intermediate right-side component. This step corresponds to the panning tool 223 shown in FIG. 2A. Finally, the data processing system 100 generates two copies of the middle component and upmixes (305) a first copy of the middle component with the intermediate left-side component and a second copy of the middle component with the intermediate right-side component to obtain a left-side component and a right-side component. This step corresponds to the upmixer 227 and the combination operation at the end of the pre-processing stage 220. In some embodiments, a gain operation using amplifiers is applied to the intermediate side components and the upmixed middle components separately to ensure that the components before the combination preserve the original location cues of the stereo input signal. In some embodiments, there is a predefined time delay between the first and second copies of the middle component before the combination. The time delay is chosen to achieve the precedence effect in the stereo audio signal.

Figure 3B:
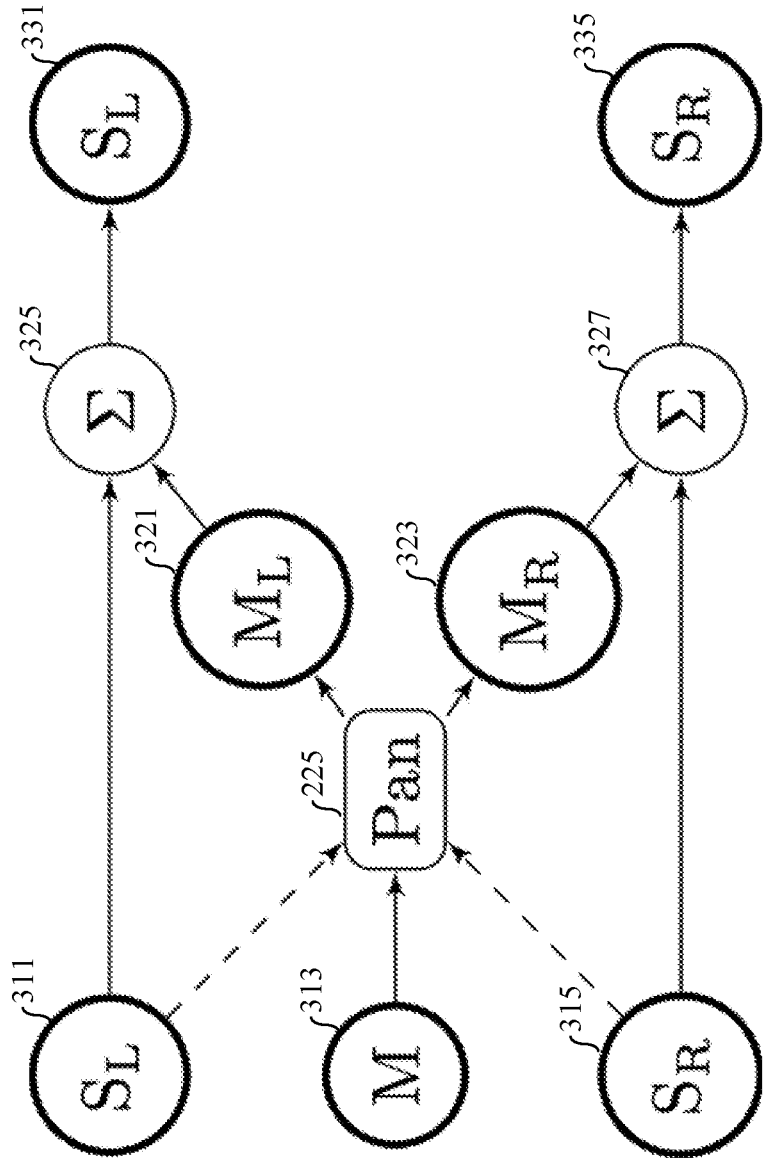
FIG. 3B is a block diagram of the pre-processing steps of creating an immersive sound effect from a stereo audio input signal in accordance with an illustrative embodiment.

FIG. 3B is a block diagram of the pre-processing steps of creating an immersive sound effect from a stereo audio input signal in accordance with an illustrative embodiment. As shown in the figure, the M/S mixer 221 generates three components, i.e., the initial left-side component $S_L$ 311, the middle component M 313, and the initial right-side component $S_R$ 315. The middle component M 313 is then split into an initial mid-left component $M_L$ 321 and an initial mid-right component $M_R$ 323. The initial left-side component $S_L$ 311 and the initial mid-left component $M_L$ 321 are combined by the combiner 325 into the intermediate left-side component $S_L$ 331 and the initial right-side component $S_L$ 315 and the initial mid-right component $M_R$ 323 are combined by the combiner 327 into the intermediate right-side component $S_R$ 335. Note that the block diagram in FIG. 3B does not include the upmixing operation and the combination operation after that.

Figure 4A:
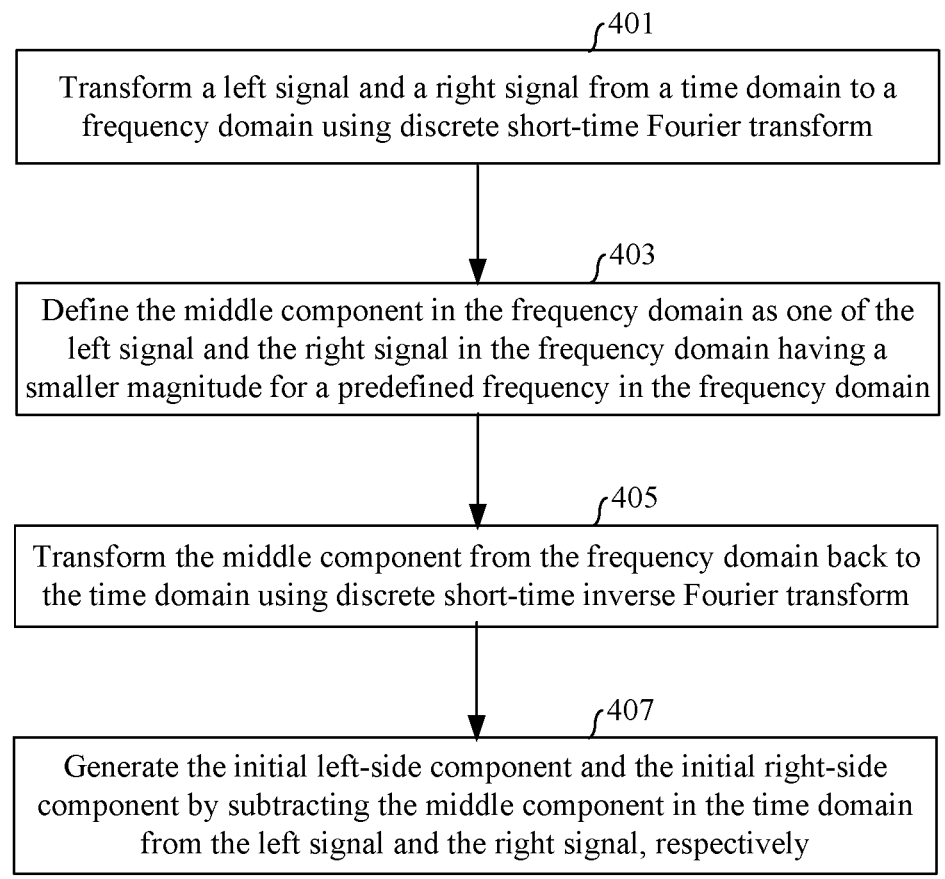
FIG. 4A is a flowchart of converting an audio signal including a left signal and a right signal into three components in accordance with an illustrative embodiment.

As noted above, the M/S mixer 221 is responsible for converting an audio signal into multiple components. FIG. 4A is a flowchart of converting a stereo audio signal including a left signal and a right signal into three components in accordance with an illustrative embodiment. The data processing system 100 first transforms (401) the left signal and the right signal from the time domain to the frequency domain using, e.g., a discrete short-time Fourier transform as follows:

$$\text{left}[n] \xrightarrow{\delta} \text{Left}(e^{jw}) = |\text{Left}(e^{jw})| \angle \text{Left}(e^{jw})$$

$$\text{right}[n] \xrightarrow{\delta} \text{Right}(e^{jw}) = |\text{Right}(e^{jw})| \angle \text{Right}(e^{jw}),$$

wherein $|X(e^{j\omega})|$ means the magnitude of each frequency $\omega$ and $\angle X(e^{j\omega})$ means the phase.

Next, the data processing system 100 defines (403) the middle component in the frequency domain as one of the left signal and the right signal that has a smaller magnitude for a particular frequency in the frequency domain. Assuming that the overlap length equal to half of the window length of the short-time Fourier transform, the spectrogram of the middle component is defined using the following equation:

$$\text{Mid}(e^{jw}) = \begin{cases} \text{Left}(e^{jw}) & \text{if } |\text{Left}(e^{jw})| < |\text{Right}(e^{jw})| \\ \text{Right}(e^{jw}) & \text{if } |\text{Right}(e^{jw})| < |\text{Left}(e^{jw})| \end{cases}.$$

After determining the middle component in the frequency domain, the data processing system 100 transforms (405) the middle component from the frequency domain back to the time domain using the discrete short-time inverse Fourier transform as follows:

$$\text{Mid}(e^{jw}) \xrightarrow{\beta^{-1}} \text{mid}[n].$$

Finally, the data processing system generates (407) the initial left-side component and the initial right-side component by subtracting the middle component from the left signal and the right signal, respectively, as follows:

$$\text{side}_L[n]=\text{left}[n]-\text{mid}[n]$$

$$\text{side}_R[n]=\text{right}[n]-\text{mid}[n].$$

Figure 4B:
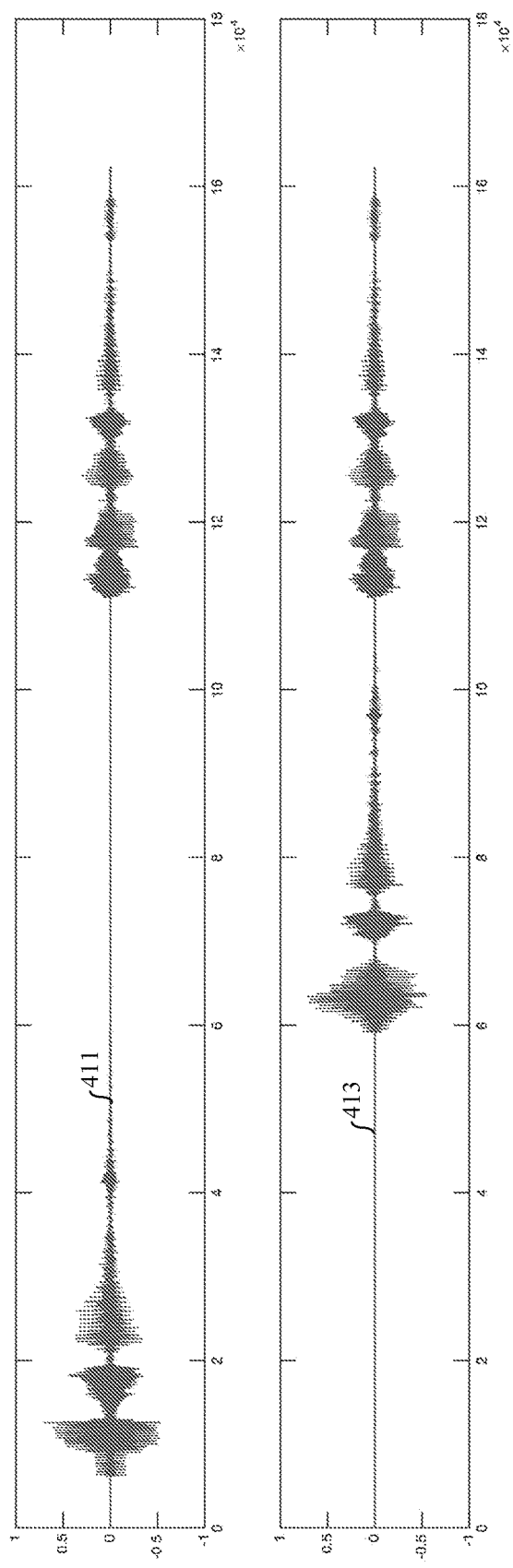
FIG. 4B is a block diagram of the left signal and the right signal of the audio signal in accordance with an illustrative embodiment.
Figure 4C:
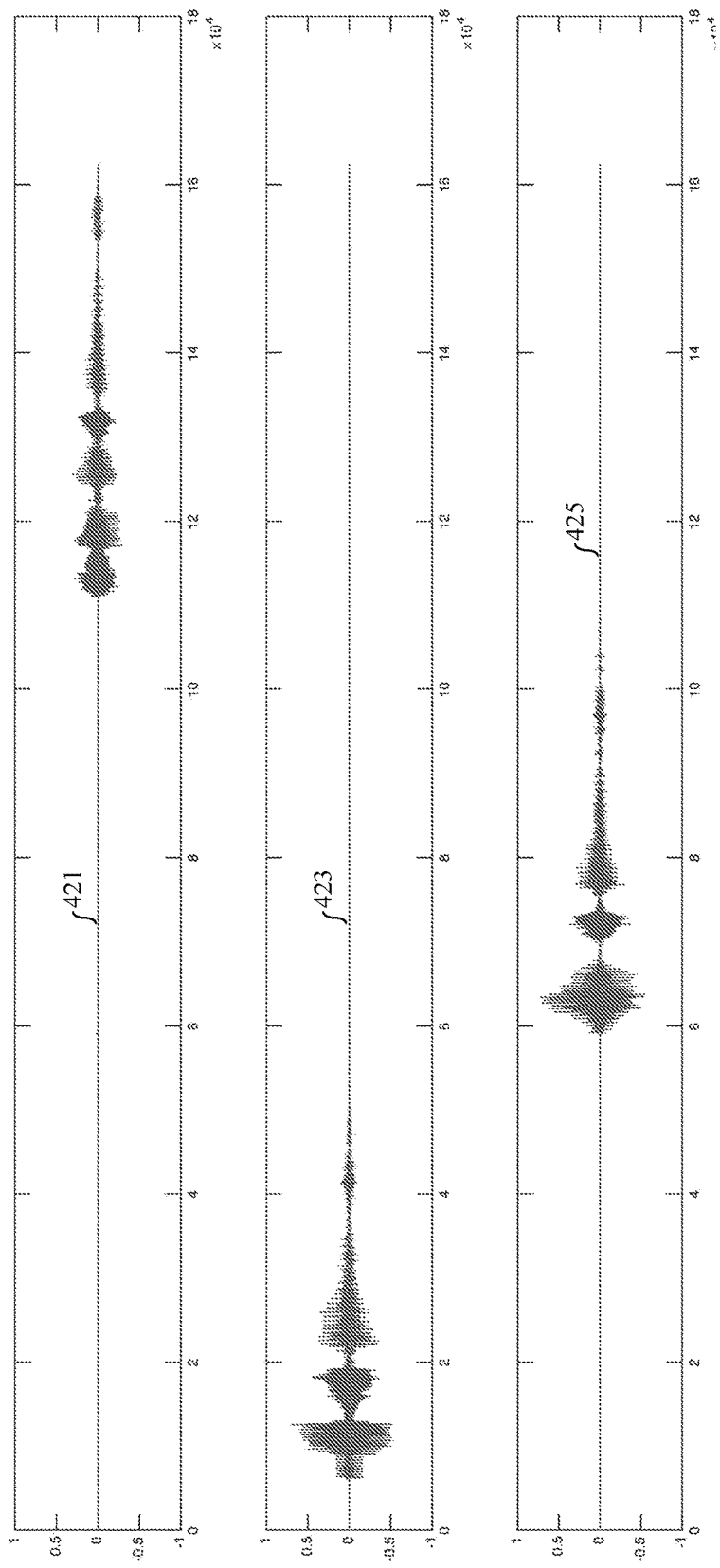
FIG. 4C is a block diagram of the three components generated from the audio signal in accordance with an illustrative embodiment.

FIG. 4B is a block diagram of the left signal and the right signal of the audio signal in accordance with an illustrative embodiment. In this example, the curve 411 represents the left signal and the curve 413 corresponds to the right signal. FIG. 4C is a block diagram of the three components generated from the audio signal shown in FIG. 4B in accordance with an illustrative embodiment. In particular, the curve 421 shown in FIG. 4C represents the middle component and the curves 423 and 425 represent the left and right components of the audio signal, respectively.

M/S mixing is widely used in recording, mixing and mastering by sound engineers. But unlike the conventional mixing process, the M/S mixer 221 generates three components ($\text{side}_L$, $\text{side}_R$ and middle) from one stereo audio signal. The $\text{side}_L$ component represents the sound source that appears only at the left channel, whereas the $\text{side}_R$ component corresponds to the sound only appears at the right channel. The middle component is the sound source that appears only in the phantom center of the sound stage, e.g., main musical element and dialog. By doing so, this process separates the information that is useful for subsequent sound stage enhancement and minimizes unnecessary distortion in the sound quality (e.g., coloration). Moreover, this step also helps lower the correlation between the left and right components.

Figure 5A:
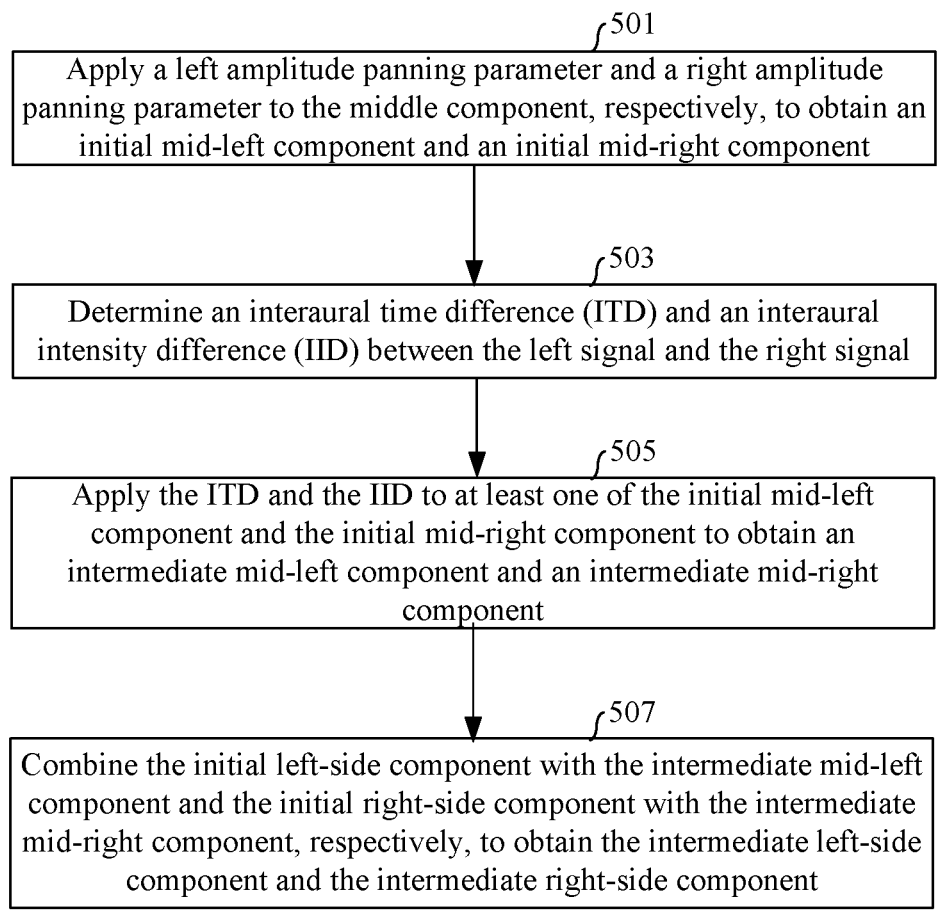
FIG. 5A is a flowchart of panning a middle component of an audio signal into two side components in accordance with an illustrative embodiment.

FIG. 5A is a flowchart of panning a middle component of an audio signal into two side components in accordance with an illustrative embodiment. The data processing system 100 first applies (501) a left amplitude panning parameter and a right amplitude panning parameter to the middle component, respectively, to obtain an initial mid-left component and an initial mid-right component as follows:

$$\text{left}'[n]=G_L(\phi)*\text{left}[n]$$

$$\text{right}'[n]=G_R(\phi)*\text{right}[n]$$

wherein $G_L$ and $G_R$ are the gains of the left and right components, respectively, and they are a function of $\varphi$, which represents the angle of the sound source. Note that panning a mono signal in a stereo speaker setting can be expressed by putting the left signal and the right signal as the mono input signal. In some embodiments, $G_L$ and $G_R$ are defined as follows:

$$G_L(\phi)=\max(1+\phi,1).$$

$$G_R(\phi)=\max(1-\phi,1)$$

wherein $-1 \leq \varphi \leq 1$ is the panning value.

Note that, in many cases, the amplitude difference between the left and right signals is not sufficient to become a working interaural localization cue as required by the auditory spatial processing. Additional interaural differences are introduced into the amplitude panning in order to be picked up by the auditory system. For example, the data processing system 100 determines (503) an interaural time difference and an interaural intensity difference (IID) between the left signal and the right signal. These interaural differences are the primary information for human auditory system to decode a spatial complex sound event. More specifically, ITD represents the difference in the arrival time of a sound at the two ears. IID, on the other hand, corresponds to the level difference between the sounds reaching the two ears, which is caused by head shadowing effect and the attenuation in propagating. Spatial cues like ITD and IID provide information as to the relative numbers and locations of sources and objects in the sound environment.

The data processing system 100 then applies (505) the ITD and the IID to at least one of the initial mid-left component and the initial mid-right component to obtain an intermediate mid-left component and an intermediate mid-right component. Such interaural differences are put back into the two components as inter-channel time and intensity differences. Finally, the data processing system 100 combines (507) the initial left-side component with the intermediate mid-left component and the initial right-side component with the intermediate mid-right component, respectively, to obtain the intermediate left-side component (corresponding to the intermediate left-side component $S_L$ 331 in FIG. 3B) and the intermediate right-side component (corresponding to the intermediate right-side component $S_R$ 335 in FIG. 3B).

Figure 5B:
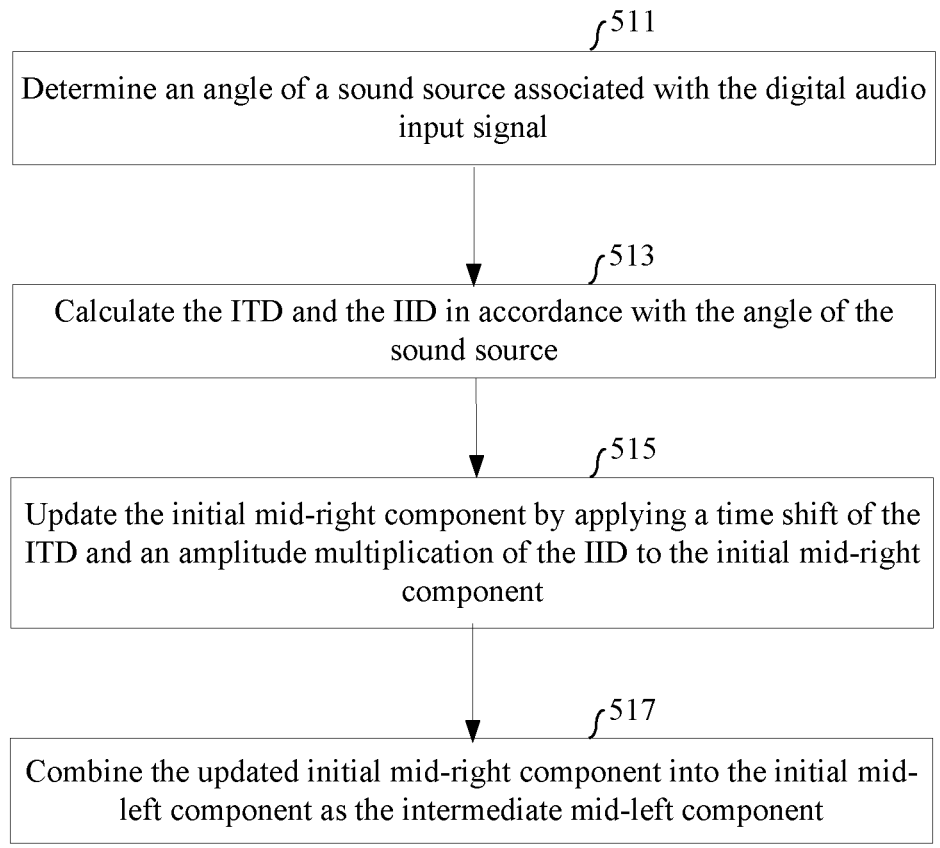
FIG. 5B is a flowchart of determining spatial cues of a sound source and applying the spatial cues to one of the mid-left and mid-right components of the audio signal in accordance with an illustrative embodiment.

FIG. 5B is a flowchart of determining spatial cues of a sound source and applying the spatial cues to one of the mid-left and mid-right components of the audio signal in accordance with an illustrative embodiment. The data processing system 100 determines (511) an angle of a sound source associated with the digital audio input signal with respect to the listener's current position.

Figure 5C:
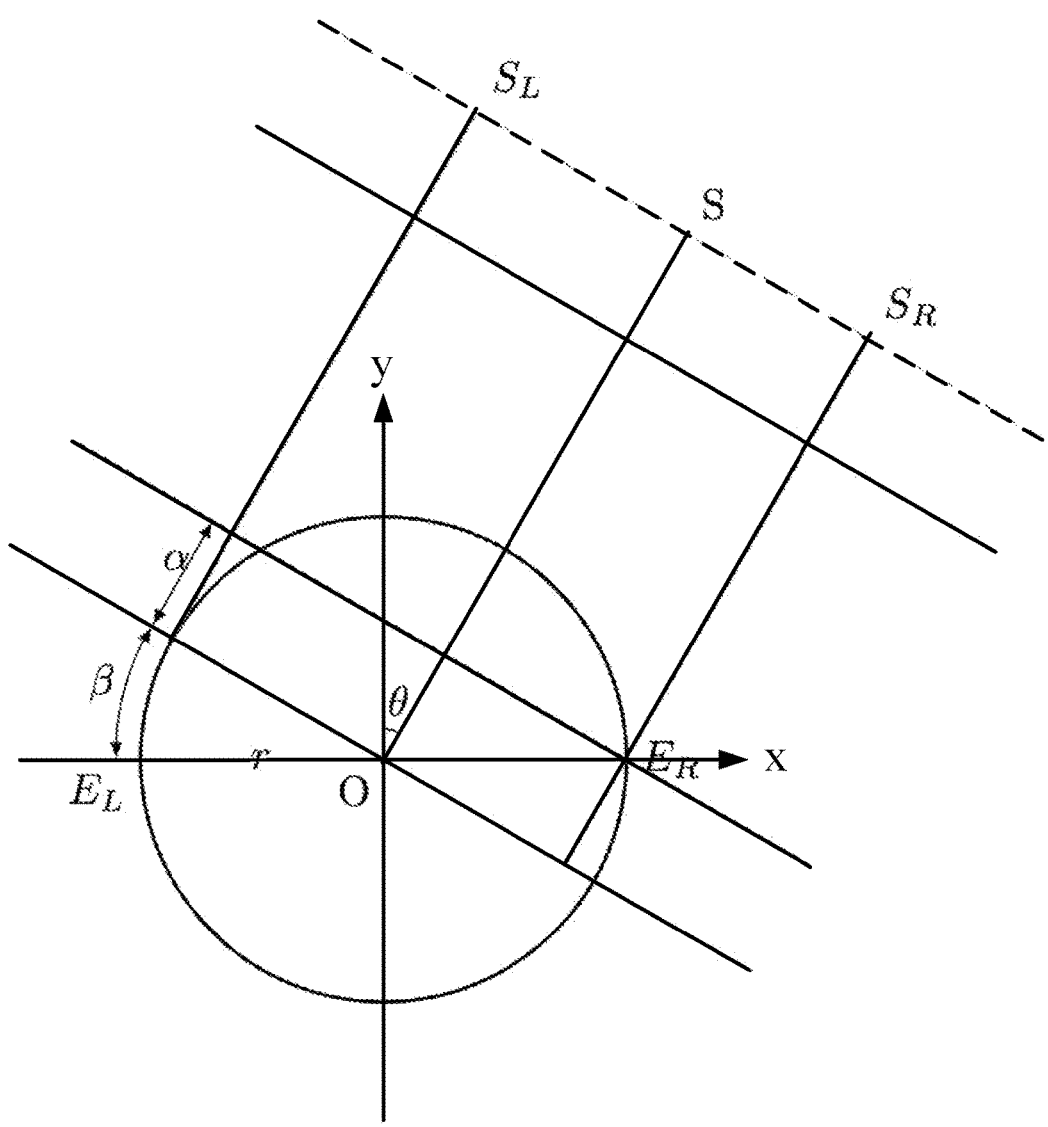
FIG. 5C is a block diagram illustrating the angle of a sound source in accordance with an illustrative embodiment.

FIG. 5C is a block diagram illustrating the angle of a sound source in accordance with an illustrative embodiment. Consider a human head placed at the origin O facing the direction of y-axis with head radius of r. The left ear is at $E_L$ and the right ear at $E_R$. Assuming a sound source S is located relatively far away from the origin, with an angle of $\theta$ relative to the y-axis, and that the sound wave is a plane wave traveling in parallel while it arrives at the head, the sound arriving at $E_L$ is coming from $S_L$ and the sound arriving at $E_R$ is from $S_R$. The distance between $S_L$ and $E_L$ is longer than the distance between $S_R$ and $E_R$ by $\alpha+\beta$, where $$\alpha = r \sin \theta, \text{ and}$$

$$\beta = r\theta.$$

The distance difference between the two sides is:

$$\alpha+\beta = r \sin \theta + r\theta = r(\sin \theta + \theta).$$

The data processing system 100 calculates (513) the ITD and the IID in accordance with the angle of the sound source. For example, the ITD can be defined as the distance difference divided by the speed of sound c as follows:

$$ITD = \frac{\text{Distance difference}}{\text{Speed of sound}} = \frac{r}{c}(\sin\theta + \theta).$$

Figure 5D:
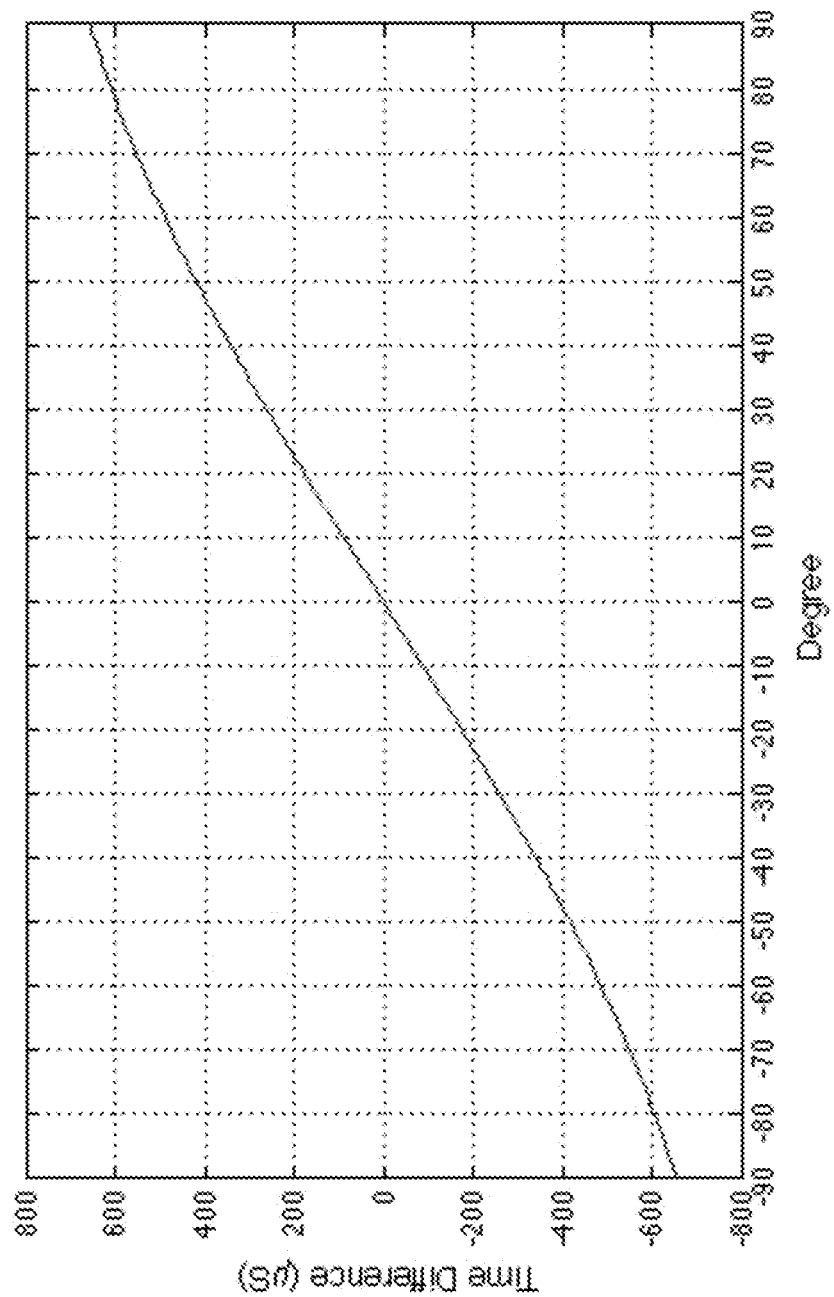
FIG. 5D is a block diagram illustrating the relationship between interaural time difference (ITD) and the sound source angle in accordance with an illustrative embodiment.

In other words, there is a small time delay at the left (i.e., far) side of the head. FIG. 5D is a block diagram illustrating the relationship between interaural time difference (ITD) and the sound source angle as defined by the formula above.

It is known that the intensity of sound SI is inversely proportional to the square of the distance d between the listener and the sound source as follows:

$$S_I \propto \frac{1}{d^2}.$$

The interaural intensity difference can then be defined as the intensity ratio between the distance travelled from the sound source to each ear:

$$IID = 20\log_{10}\left(\frac{S_L E_L}{S_R E_R}\right)$$

Assuming the distance of between SR and ER is equal to 1 meter, then $$IID = 20\log_{10}\left(\frac{S_L E_L}{S_R E_R}\right) = 20\log_{10}(\overline{S_L E_L}) = 20\log_{10}(1 + r(\theta + \sin\theta)).$$

In some embodiments, a head shadow constant m is introduced to take into the consideration that the head is blocking the sound wave as follows:

IID=$m$20 log$_{10}$(1+$r$($\theta$+sin $\theta$)).

Figure 5E:
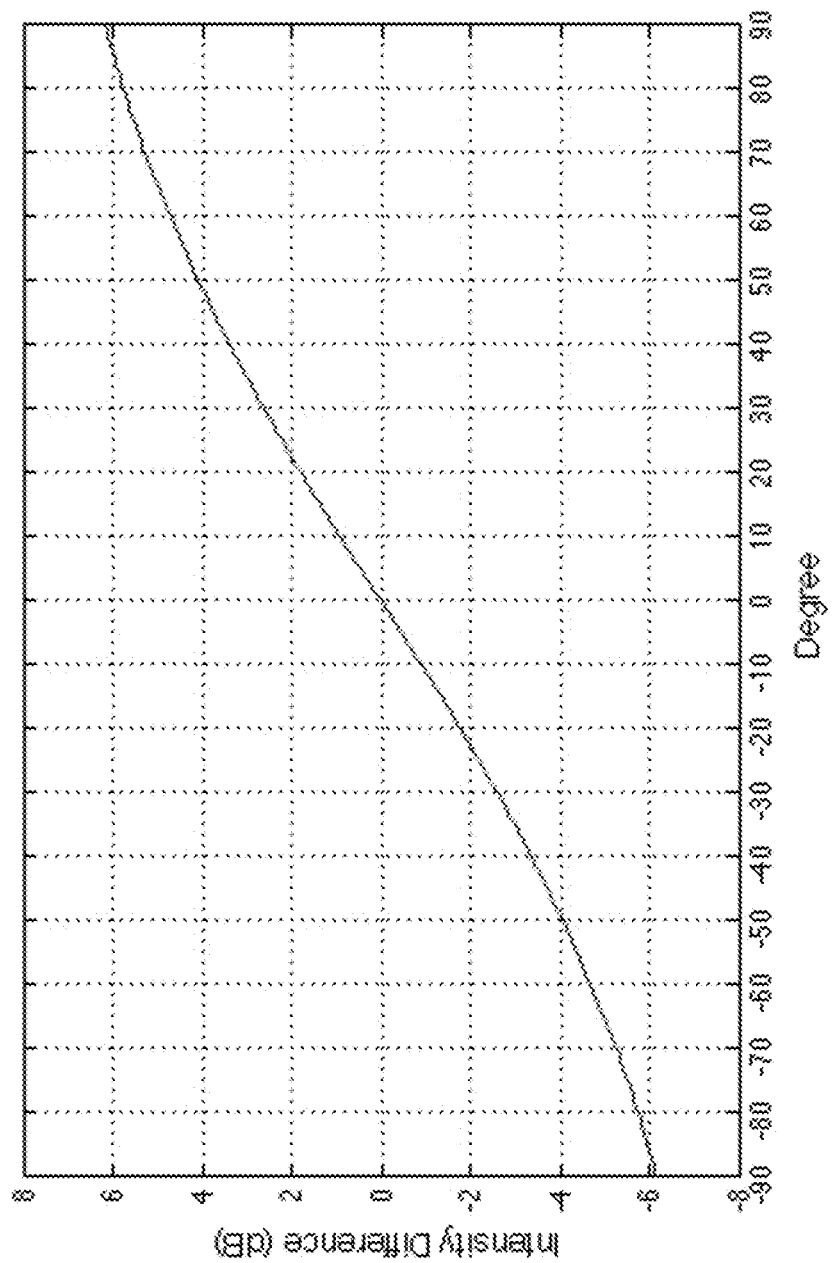
FIG. 5E is a block diagram illustrating the relationship between interaural intensity difference (IID) and the sound source angle in accordance with an illustrative embodiment.

FIG. 5E is a block diagram illustrating the relationship between interaural intensity difference (IID) and the sound source angle in accordance with an illustrative embodiment as defined by the formula above.

Using the ITD and IID curves shown in FIGS. 5D and 5E, the data processing system 100 updates (515), e.g., the initial mid-right component by applying a time shift defined by the ITD and an amplitude multiplication defined by the IID to the initial mid-right components as follows:

right"[$n$]=$A_{IID}$right'[$n$−$t_{ITD}$].

Next, the data processing system 100 combines (517) the updated initial mid-right component with the initial mid-left component to be the intermediate mid-left component as follows:

left"[$n$]=left'[$n$]+right"[$n$].

Figure 6:
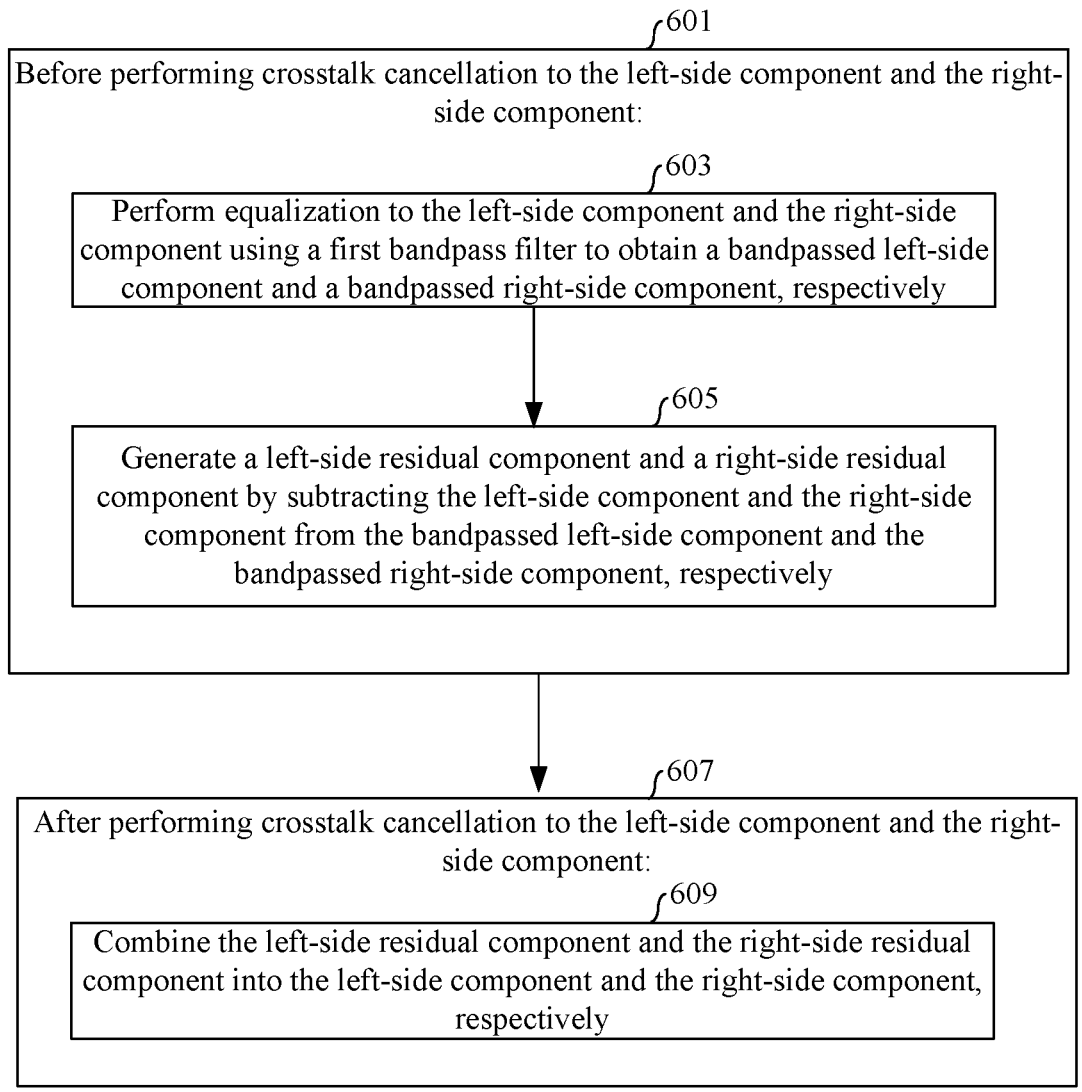
FIG. 6 is a flowchart of processing steps before and after performing crosstalk cancellation to the left-side and right-side components of an audio signal in accordance with an illustrative embodiment.

As describe above in connection with FIG. 2A, there are multiple processing blocks in the sound enhancement processing stage 230 before the crosstalk cancellation block 235. Similarly, there is at least one processing block in the post-processing stage 240 after the crosstalk cancellation block 235. FIG. 6 is a flowchart of processing steps before and after performing crosstalk cancellation to the left-side and right-side components of an audio signal in accordance with an illustrative embodiment.

Before performing the crosstalk cancellation to the left-side component and the right-side component (601), the data processing system 100 performs (603) equalization to the left-side component and the right-side component using a first bandpass filter to obtain a bandpass-filtered left-side component and a bandpass-filtered right-side component. In some embodiments, the first bandpass filter is to minimize the unwanted coloration caused by the comb filtering caused by the crosstalk cancellation block 235 and to keep the sound stage width from shrinking. Crosstalk cancellation has a side effect of comb filtering. A comb filter happens when two or more copies of a sound signal are identical but have phase differences. It is named by the shape of the filter's frequency response, which consists of a series of regularly spaced spikes. In order to reduce the effect of comb filtering, the first bandpass filter is introduced in the EQ block 231 before the left and right signals enter the crosstalk cancellation block 235. By suppressing the audio signal outside a predefined frequency range, the amount of the comb filtering effect can be better controlled, thus reduce the coloration of the output signals. By bandpass filtering the audio signals before crosstalk cancellation, the auditory system can ignore the ambiguous information, which the auditory system cannot solve through head movement.

It has been found that there is a predefined frequency range that produces the best response with the invention disclosed in the present application. Human auditory system detects and compares differences in the movement of the two eardrums. Each neuron has a specific frequency range that it is most sensitive to. Moreover, there are some other physical and physiological constraints affecting the performance of the human auditory system. For example, the auditory neuron has a perception threshold to reach to fire an impulse, it requires some time to cool down until the next fire. In order to make the process more efficient and more effective, it is found that the best frequency of response for the invention disclosed herein is approximately 150 to 6000 Hz, and preferably from 150 to 2300 Hz.

As shown in FIG. 2A, the residual from the first bandpass filter is added back to the result signal after the crosstalk cancellation step. To do so, the data processing system 100 generates (605) a left-side residual component and a right-side residual component by subtracting the left-side component and the right-side component from the bandpass-filtered left-side component and the bandpass-filtered right-side component, respectively. In some embodiments, an amplifier is applied to the residual signal and the result signal from the crosstalk cancellation step to adjust the gains of the two signals before they are combined together.

FIGS. 7A-7C are flowcharts of dynamic range compression of an audio signal in accordance with an illustrative embodiment. In some embodiments, a second bandpass filter is included in the DRC block 233. A user (e.g., a sound engineer) can adjust the second bandpass filter to window out a specific frequency band before applying the crosstalk cancellation. By doing so, the user can highlight certain specific sound events of his/her choice. For example, after performing equalization to the left-side component and the right-side component using the first bandpass filter (701), the data processing system 100 removes (703) a predefined frequency band from the left-side component and the right-side component using a second bandpass filter. Representative bandpass filters used in the EQ block 231 and the DRC block 233 include a biquadratic filter or a Butterworth filter.

In some embodiments, after performing equalization to the left-side component and the right-side component using the first bandpass filter (711), the data processing system 100 performs (713) first dynamic range compression to the left-side component and the right-side component to highlight a predefined frequency band with respect to other frequencies.

In some embodiments, after combining the left-side residual component and the right-side residual component into the left-side component and the right-side component, respectively, the data processing system 100 performs (723) second dynamic range compression to the left-side component and the right-side component to preserve the localization cues in the digital audio output signals.

In some embodiments, the cross-correlation between the two channels (left and right) is maximized when putting the localization information back into the sound signal. As a result, the resulting sound stage width may be too wide for certain types of sound such as classical music or background music for films. This issue can be addressed by adjusting the width of the sound stage using the following equation:

$$\text{Left}'[n] = \text{Left}[n] - \frac{\beta}{1-\beta}\text{Right}[n]$$

$$\text{Right}'[n] = \text{Right}[n] - \frac{\beta}{1-\beta}\text{Left}[n]$$

where $-5 \leq \beta \leq 0$ is the stage width parameter. The resulting signal has the maximum sound stage width when $\beta=0$, and is close to a mono signal when $\beta=-5$.

The examples above assume that the input signal is a stereo audio signal (two channels) or a mono audio signal (one channel). But the same process pipeline can be easily adapted for processing a multi-channel audio input signal (including more than two channels) or generating a multi-channel audio output signal.

Figure 8A:
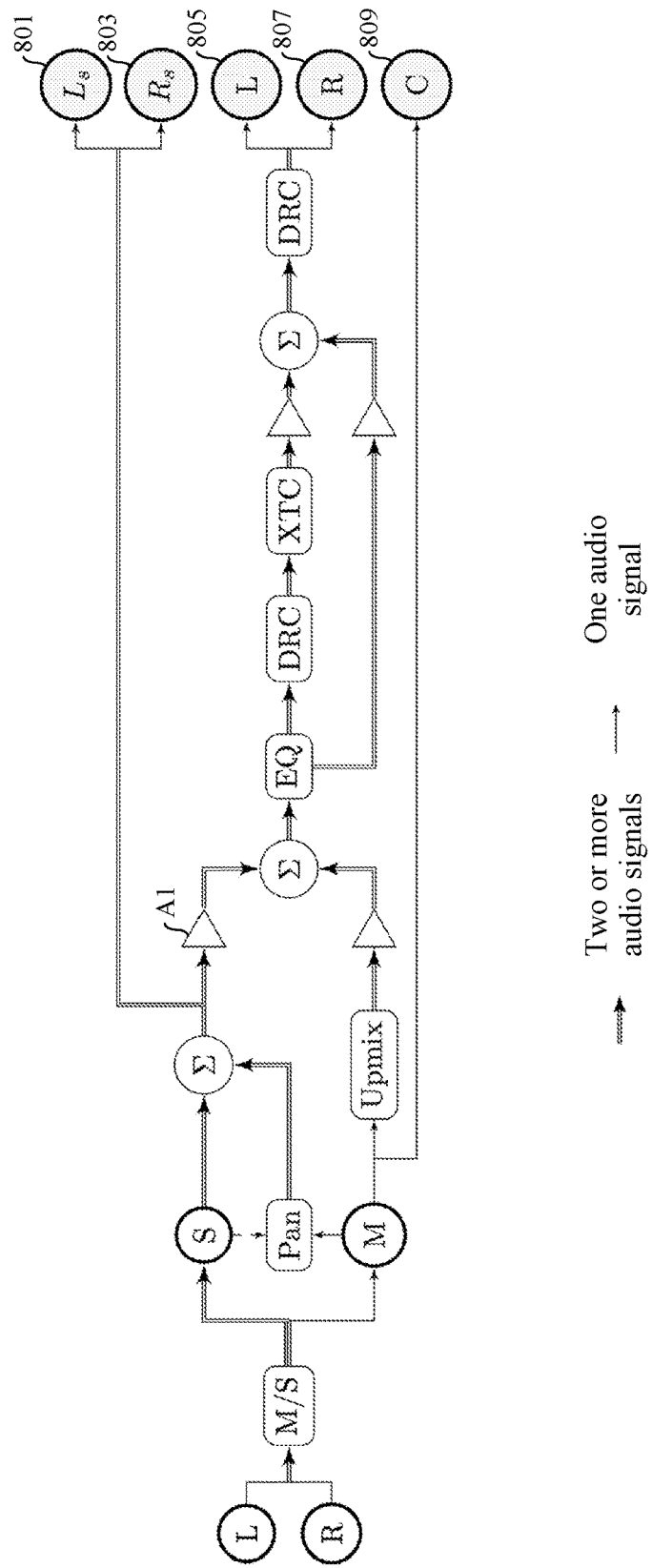
FIGS. 8A-8C are block diagrams illustrating different sound processing stages of converting stereo/multichannel sound signals into multichannel/stereo sound signals in accordance with an illustrative embodiment.
Figure 8B:
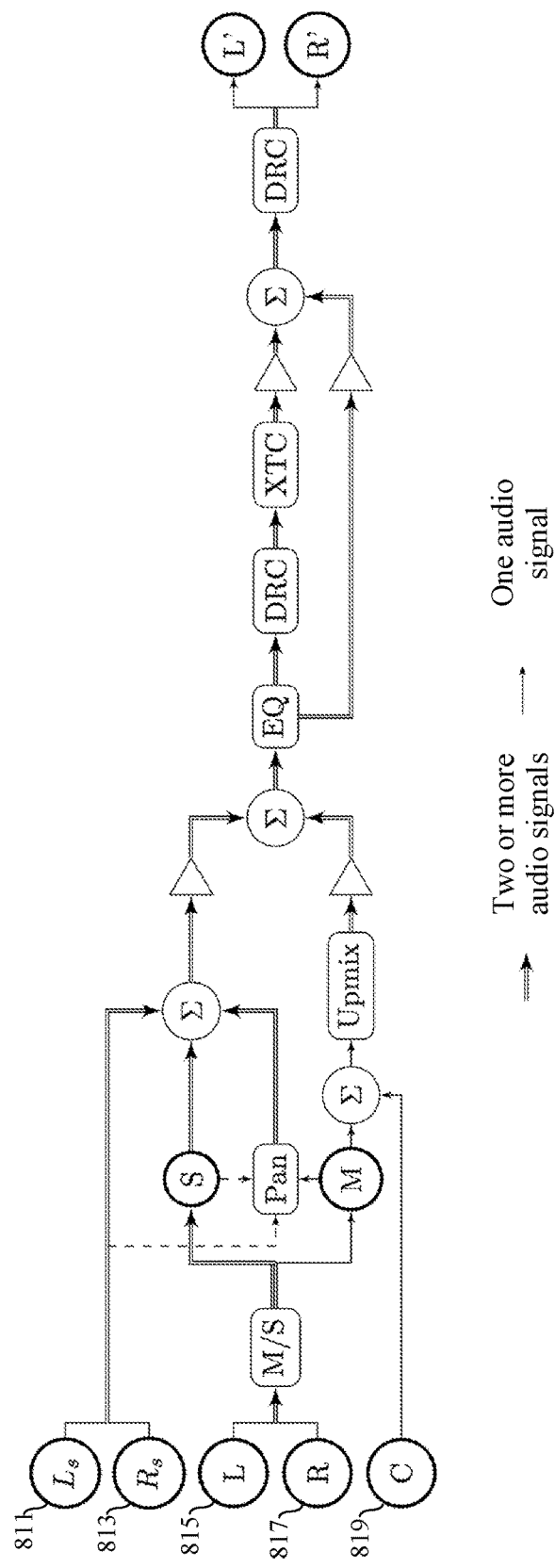
Figure 8C:
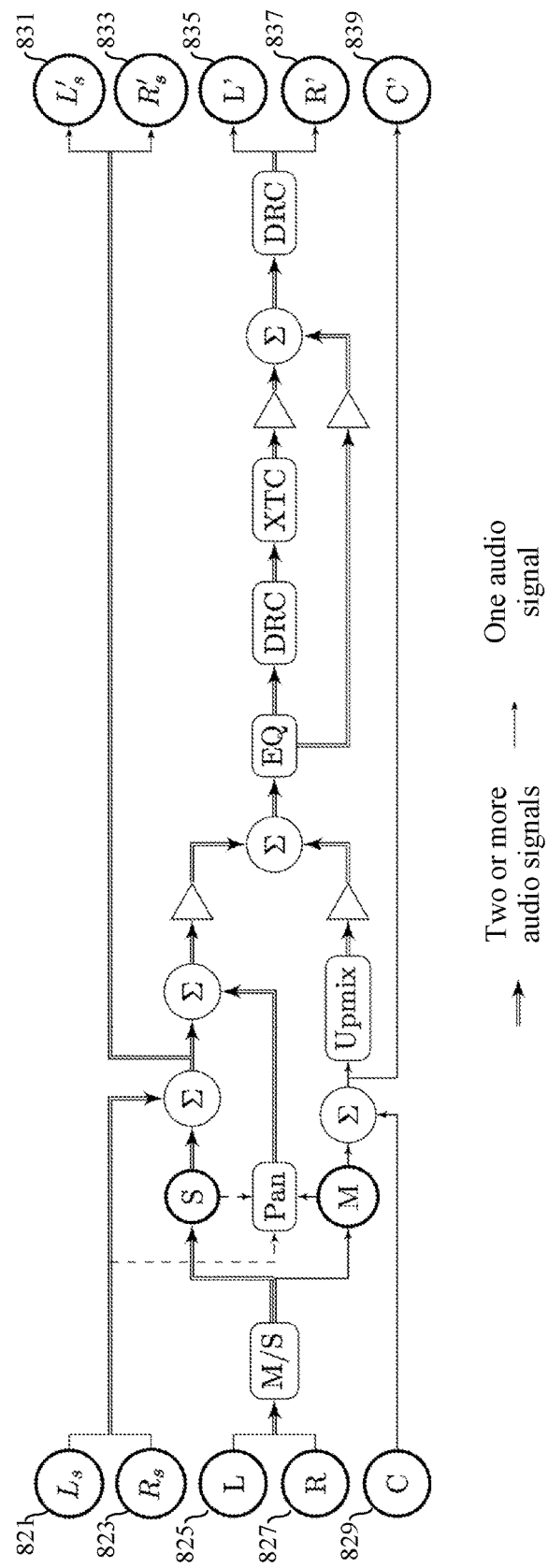

FIGS. 8A-8C are block diagrams illustrating different sound processing stages of converting stereo/multichannel sound signals into multichannel/stereo sound signals in accordance with an illustrative embodiment.

As shown in FIG. 8A, the pipeline is similar to the one shown in FIG. 2A. The input to the pipeline is a stereo audio signal having a left channel and a right channel. The output of the pipeline is a multi-channel audio signal having five channels, i.e., a left surround channel ($L_S$) 801, a right surround channel ($R_S$) 803, a left channel (L) 805, a right channel (R) 807, and a center channel (C) 809. In this example, the left surround channel ($L_S$) 801 and the right surround channel ($R_S$) 803 are the left-side component and the right-side component after the panning step. The center channel (C) 809 is the middle component generated by the M/S mixer. Note that the left surround channel ($L_S$) 801 and the right surround channel ($R_S$) 803 correspond to the intermediate left-side component and the intermediate right-side component as described above in connection with FIG. 3A. In some embodiments (not shown in FIG. 8A), the left surround channel ($L_S$) 801 and the right surround channel ($R_S$) 803 are further amplified before being fed into corresponding speakers of a multi-channel audio system. In some other embodiments, the left surround channel ($L_S$) 801 and the right surround channel ($R_S$) 803 are the output signals of the amplifier A1 shown in FIG. 8A.

As shown in FIG. 8B, the pipeline is similar to the one shown in FIG. 2A except that the input to the pipeline is a multi-channel audio signal having five channels, i.e., a left surround channel ($L_S$) 811, a right surround channel ($R_S$) 813, a left channel (L) 815, a right channel (R) 817, and a center channel (C) 819. In this example, the left surround channel ($L_S$) 811 and the right surround channel ($R_S$) 813 are combined into the left-side component and the right-side component after the panning step. The center channel (C) 819 is also combined into the middle component generated by the M/S mixer. After the pre-processing stage that combines the five channels into two channels, the remaining operations are the same as the one shown in FIG. 2A.

Finally, FIG. 8C depicts a pipeline whose input and output are both multi-channel audio signals having five channels. The input multi-channel audio signal has a left surround channel ($L_S$) 821, a right surround channel ($R_S$) 823, a left channel (L) 825, a right channel (R) 827, and a center channel (C) 829. The output multi-channel audio signal has a left surround channel ($L'_S$) 831, a right surround channel ($R'_S$) 833, a left channel (L') 835, a right channel (R') 837, and a center channel (C') 839. In this example, the left surround channel ($L_S$) 821 and the right surround channel ($R_S$) 823 are combined into the left-side component and the right-side component after the panning step and then output as the left surround channel ($L'_S$) 831 and the right surround channel ($R'_S$) 833. The center channel (C) 819 is also combined into the middle component generated by the M/S mixer and then output as the center channel (C') 839. The processing steps of generating the left channel (L') 835 and the right channel (R') 837 remain the same as the one shown in FIG. 2A.

Finally, it should be noted that the invention can take the form of an entirely hardware embodiment, an entirely software embodiment or an embodiment containing both hardware and software elements. In a preferred embodiment, the invention is implemented in software, which includes but is not limited to firmware, resident software, microcode, etc.

Furthermore, the invention can take the form of a computer program product accessible from a computer-usable or computer-readable medium providing program code for use by or in connection with a computer or any instruction execution system. For the purposes of this description, a computer-usable or computer readable medium can be any tangible apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution. In some embodiments, the data processing system is implemented in the form of a semiconductor chip (e.g., a system-on-chip) that integrates all components of a computer or other electronic system into a single chip substrate.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

The description of the present application has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

The terminology used in the description of the embodiments herein is for the purpose of describing particular embodiments only and is not intended to limit the scope of claims. As used in the description of the embodiments and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will also be understood that, although the terms first, second, etc. may be used herein to describe various elements, these elements should not be limited by these terms. These terms are only used to distinguish one element from another. For example, a first port could be termed a second port, and, similarly, a second port could be termed a first port, without departing from the scope of the embodiments. The first port and the second port are both ports, but they are not the same port.

Many modifications and alternative embodiments of the embodiments described herein will come to mind to one skilled in the art having the benefit of the teachings presented in the foregoing descriptions and the associated drawings. Therefore, it is to be understood that the scope of claims are not to be limited to the specific examples of the embodiments disclosed and that modifications and other embodiments are intended to be included within the scope of the appended claims. Although specific terms are employed herein, they are used in a generic and descriptive sense only and not for purposes of limitation.

The embodiments were chosen and described in order to best explain the underlying principles and their practical applications, to thereby enable others skilled in the art to best utilize the underlying principles and various embodiments with various modifications as are suited to the particular use contemplated.

What is claimed is:

1. A method for processing an audio signal, comprising:
    at a computing device having one or more processors, at least two speakers, memory, and a plurality of program modules stored in the memory and to be executed by the one or more processors:
    receiving a digital mono audio input signal;
    extracting localization cues from the digital mono audio input signal;
    generating a left-side component and a right-side component from the digital mono audio input signal, at least partially, in accordance with the localization cues, wherein generating the left-side component and the right-side component from the digital mono audio input signal further includes:
        panning the digital mono audio input signal into an initial left-side component and an initial right-side component, respectively, in accordance with the localization cues; and
        upmixing a first copy of the digital mono audio input signal with the initial left-side component and a second copy of the digital mono audio input signal with the initial right-side component, respectively, to obtain the left-side component and the right-side component, wherein there is a predefined time interval between the first and second copies of the digital mono audio input signal;
    performing crosstalk cancellation to the left-side component and the right-side component, respectively, to obtain a crosstalk-cancelled left-side component and a crosstalk-cancelled right-side component; and
    generating a digital stereo audio output signal including the crosstalk-cancelled left-side component and the crosstalk-cancelled right-side component.

2. The method of claim 1, wherein the digital mono audio input signal, the initial left-side component and the initial right-side component correspond to a center channel, a left surround signal and a right surround channel of a multi-channel audio system, respectively.

3. The method of claim 1, wherein the step of panning the digital mono audio input signal into an initial left-side component and an initial right-side component, respectively, in accordance with the localization cues further includes:
    applying a left amplitude panning parameter and a right amplitude panning parameter to the digital mono audio input signal, respectively, to obtain an initial mid-left component and an initial mid-right component;
    determining an interaural time difference (ITD) and an interaural intensity difference (IID) in accordance with the localization cues; and
    applying the ITD and the IID to at least one of the initial mid-left component and the initial mid-right component to obtain the initial left-side component and the initial right-side component.

4. The method of claim 1, further comprising:
    before performing crosstalk cancellation to the left-side component and the right-side component:
        performing equalization to the left-side component and the right-side component using a first bandpass filter to obtain a bandpass-filtered left-side component and a bandpass-filtered right-side component, respectively;
        generating a left-side residual component and a right-side residual component by subtracting the left-side component and the right-side component from the bandpass-filtered left-side component and the bandpass-filtered right-side component, respectively; and
    after performing crosstalk cancellation to the left-side component and the right-side component:
        combining the left-side residual component and the right-side residual component into the crosstalk-cancelled left-side component and the crosstalk-cancelled right-side component, respectively.

5. The method of claim 4, further comprising:
after performing equalization to the left-side component and the right-side component using the first bandpass filter:
removing a predefined frequency band from the left-side component and the right-side component using a second bandpass filter.

6. The method of claim 4, further comprising:
after performing equalization to the left-side component and the right-side component using the first bandpass filter:
performing first dynamic range compression to the left-side component and the right-side component to highlight a predefined frequency band with respect to other frequencies.

7. The method of claim 4, further comprising:
after combining the left-side residual component and the right-side residual component into the left-side component and the right-side component, respectively:
performing second dynamic range compression to the crosstalk-cancelled left-side component and the crosstalk-cancelled right-side component to preserve the localization cues in the digital stereo audio output signal.

8. A computing device for processing an audio signal, comprising:
one or more processors;
memory; and
a plurality of program modules stored in the memory and to be executed by the one or more processors, wherein the plurality of program modules, when executed by the one or more processors, cause the computing device to perform a plurality of steps including:
receiving a digital mono audio input signal;
extracting localization cues from the digital mono audio input signal;
generating a left-side component and a right-side component from the digital mono audio input signal, at least partially, in accordance with the localization cues, wherein generating the left-side component and the right-side component from the digital mono audio input signal further includes:
panning the digital mono audio input signal into an initial left-side component and an initial right-side component, respectively, in accordance with the localization cues; and
upmixing a first copy of the digital mono audio input signal with the initial left-side component and a second copy of the digital mono audio input signal with the initial right-side component, respectively, to obtain the left-side component and the right-side component, wherein there is a predefined time interval between the first and second copies of the digital mono audio input signal;
performing crosstalk cancellation to the left-side component and the right-side component, respectively, to obtain a crosstalk-cancelled left-side component and a crosstalk-cancelled right-side component; and
generating a digital stereo audio output signal including the crosstalk-cancelled left-side component and the crosstalk-cancelled right-side component.

9. The computing device of claim 8, wherein the digital mono audio input signal, the initial left-side component and the initial right-side component correspond to a center channel, a left surround signal and a right surround channel of a multi-channel audio system, respectively.

10. The computing device of claim 8, wherein the step of panning the digital mono audio input signal into an initial left-side component and an initial right-side component, respectively, in accordance with the localization cues further includes:
applying a left amplitude panning parameter and a right amplitude panning parameter to the digital mono audio input signal, respectively, to obtain an initial mid-left component and an initial mid-right component;
determining an interaural time difference (ITD) and an interaural intensity difference (IID) in accordance with the localization cues; and
applying the ITD and the IID to at least one of the initial mid-left component and the initial mid-right component to obtain the initial left-side component and the initial right-side component.

11. The computing device of claim 8, wherein the plurality of steps further include:
before performing crosstalk cancellation to the left-side component and the right-side component:
performing equalization to the left-side component and the right-side component using a first bandpass filter to obtain a bandpass-filtered left-side component and a bandpass-filtered right-side component, respectively;
generating a left-side residual component and a right-side residual component by subtracting the left-side component and the right-side component from the bandpass-filtered left-side component and the bandpass-filtered right-side component, respectively; and
after performing crosstalk cancellation to the left-side component and the right-side component:
combining the left-side residual component and the right-side residual component into the crosstalk-cancelled left-side component and the crosstalk-cancelled right-side component, respectively.

12. The computing device of claim 11, wherein the plurality of steps further include:
after performing equalization to the left-side component and the right-side component using the first bandpass filter:
removing a predefined frequency band from the left-side component and the right-side component using a second bandpass filter.

13. The computing device of claim 11, wherein the plurality of steps further include:
after performing equalization to the left-side component and the right-side component using the first bandpass filter:
performing first dynamic range compression to the left-side component and the right-side component to highlight a predefined frequency band with respect to other frequencies.

14. The computing device of claim 11, wherein the plurality of steps further include:
after combining the left-side residual component and the right-side residual component into the left-side component and the right-side component, respectively:
performing second dynamic range compression to the crosstalk-cancelled left-side component and the crosstalk-cancelled right-side component to preserve the localization cues in the digital stereo audio output signal.

15. A non-transitory computer readable storage medium storing a computer program product in connection with a computing device having one or more processors for processing an audio signal, the computer program product including a plurality of program modules that, when executed by the one or more processors, cause the computing device to perform a plurality of steps including:
- receiving a digital mono audio input signal;
- extracting localization cues from the digital mono audio input signal;
- generating a left-side component and a right-side component from the digital mono audio input signal, at least partially, in accordance with the localization cues, wherein generating the left-side component and the right-side component from the digital mono audio input signal further includes:
  - panning the digital mono audio input signal into an initial left-side component and an initial right-side component, respectively, in accordance with the localization cues; and
  - upmixing a first copy of the digital mono audio input signal with the initial left-side component and a second copy of the digital mono audio input signal with the initial right-side component, respectively, to obtain the left-side component and the right-side component, wherein there is a predefined time interval between the first and second copies of the digital mono audio input signal;
- performing crosstalk cancellation to the left-side component and the right-side component, respectively, to obtain a crosstalk-cancelled left-side component and a crosstalk-cancelled right-side component; and
- generating a digital stereo audio output signal including the crosstalk-cancelled left-side component and the crosstalk-cancelled right-side component.

16. The non-transitory computer readable storage medium of claim 15, wherein the digital mono audio input signal, the initial left-side component and the initial right-side component correspond to a center channel, a left surround signal and a right surround channel of a multi-channel audio system, respectively.

17. The non-transitory computer readable storage medium of claim 15, wherein the step of panning the digital mono audio input signal into an initial left-side component and an initial right-side component, respectively, in accordance with the localization cues further includes:
- applying a left amplitude panning parameter and a right amplitude panning parameter to the digital mono audio input signal, respectively, to obtain an initial mid-left component and an initial mid-right component;
- determining an interaural time difference (ITD) and an interaural intensity difference (IID) in accordance with the localization cues; and
- applying the ITD and the IID to at least one of the initial mid-left component and the initial mid-right component to obtain the initial left-side component and the initial right-side component.

18. The non-transitory computer readable storage medium of claim 15, wherein the plurality of steps further include:
- before performing crosstalk cancellation to the left-side component and the right-side component:
  - performing equalization to the left-side component and the right-side component using a first bandpass filter to obtain a bandpass-filtered left-side component and a bandpass-filtered right-side component, respectively;
  - generating a left-side residual component and a right-side residual component by subtracting the left-side component and the right-side component from the bandpass-filtered left-side component and the bandpass-filtered right-side component, respectively; and
- after performing crosstalk cancellation to the left-side component and the right-side component:
  - combining the left-side residual component and the right-side residual component into the crosstalk-cancelled left-side component and the crosstalk-cancelled right-side component, respectively.

19. The non-transitory computer readable storage medium of claim 18, wherein the plurality of steps further include:
- after performing equalization to the left-side component and the right-side component using the first bandpass filter:
  - removing a predefined frequency band from the left-side component and the right-side component using a second bandpass filter.

20. The non-transitory computer readable storage medium of claim 18, wherein the plurality of steps further include:
- after performing equalization to the left-side component and the right-side component using the first bandpass filter:
  - performing first dynamic range compression to the left-side component and the right-side component to highlight a predefined frequency band with respect to other frequencies.

21. The non-transitory computer readable storage medium of claim 18, wherein the plurality of steps further include:
- after combining the left-side residual component and the right-side residual component into the left-side component and the right-side component, respectively:
  - performing second dynamic range compression to the crosstalk-cancelled left-side component and the crosstalk-cancelled right-side component to preserve the localization cues in the digital stereo audio output signal.

* * * * *